(12) United States Patent
Yang

(10) Patent No.: US 11,894,373 B2
(45) Date of Patent: Feb. 6, 2024

(54) SEMICONDUCTOR DEVICE AND MANUFACTURING METHOD THEREOF

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 162 days.

(21) Appl. No.: 17/083,342

(22) Filed: Oct. 29, 2020

(65) Prior Publication Data

US 2022/0093593 A1 Mar. 24, 2022

(30) Foreign Application Priority Data

Sep. 24, 2020 (CN) .......................... 202011013769.9

(51) Int. Cl.
| | | |
|---|---|---|
| *H01L 27/092* | (2006.01) | |
| *H01L 27/11* | (2006.01) | |
| *H01L 21/8234* | (2006.01) | |
| *H01L 21/822* | (2006.01) | |
| *H10B 10/00* | (2023.01) | |

(52) U.S. Cl.
CPC ........ *H01L 27/092* (2013.01); *H01L 21/8221* (2013.01); *H01L 21/823412* (2013.01); *H01L 21/823418* (2013.01); *H01L 21/823437* (2013.01); *H01L 21/823475* (2013.01); *H10B 10/125* (2023.02)

(58) Field of Classification Search
CPC ............... H01L 27/092; H01L 27/1108; H01L 27/0688; H01L 29/0673; H01L 29/47392; H10B 10/125
See application file for complete search history.

(56) References Cited

U.S. PATENT DOCUMENTS

| | | | |
|---|---|---|---|
| 8,466,451 | B2 | 6/2013 | Chang |
| 10,164,121 | B2 | 12/2018 | Hatcher |
| 10,304,833 | B1* | 5/2019 | Suvarna ............... H01L 29/0673 |
| 2017/0040321 | A1* | 2/2017 | Mitard .................. H01L 29/165 |
| 2019/0131184 | A1* | 5/2019 | Ando .................... H01L 27/092 |

(Continued)

*Primary Examiner* — John A Bodnar
(74) *Attorney, Agent, or Firm* — Winston Hsu

(57) ABSTRACT

A semiconductor device includes a substrate, a first transistor and a second transistor disposed on the substrate, and a first contact structure. The first transistor includes first semiconductor channel layers stacked and separated from one another, and a first source/drain structure and a second source/drain structure disposed at two opposite sides of and connected with each first semiconductor channel layer. The second transistor includes second semiconductor channel layers disposed above the first semiconductor channel layers, stacked, and separated from one another, and a third source/drain structure and a fourth source/drain structure disposed at two opposite sides of and connected with each second semiconductor channel layer. The first contact structure penetrates through the third source/drain structure. The first source/drain structure is electrically connected with the third source/drain structure via the first contact structure, and a part of the first source/drain structure is disposed between the substrate and the first contact structure.

13 Claims, 22 Drawing Sheets

(56) References Cited

U.S. PATENT DOCUMENTS

| | | | |
|---|---|---|---|
| 2019/0131395 A1* | 5/2019 | Lee | H01L 29/0653 |
| 2019/0319095 A1* | 10/2019 | Zhang | H01L 29/1037 |
| 2019/0326286 A1* | 10/2019 | Xie | H01L 29/401 |
| 2020/0098756 A1 | 3/2020 | Lilak | |
| 2020/0118891 A1 | 4/2020 | Cheng | |
| 2020/0203343 A1* | 6/2020 | Zhu | H01L 27/0922 |
| 2022/0037497 A1* | 2/2022 | Chung | H01L 21/823807 |

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including transistors and a manufacturing method thereof.

2. Description of the Prior Art

The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor. For example, dual-gate fin field effect transistor (FinFET) device, tri-gate FinFET device, and omega-FinFET device have been provided. Furthermore, gate-all-around (GAA) nanowire FET device is progressed for achieving the ongoing goals of high performance, increased miniaturization of integrated circuit components, and greater packaging density of integrated circuits. However, under the concept of the GAA, how to further increase the unit density through process and/or structural design is still the direction of continuous efforts by people in related fields.

SUMMARY OF THE INVENTION

It is one of the objectives of the present invention to provide a semiconductor device and a manufacturing method thereof. A contact structure is used to electrically connect source/drain structures of two transistors stacked with each other for reducing the area occupied by the semiconductor device.

A semiconductor device is provided in an embodiment of the present invention. The semiconductor device includes a substrate, a first transistor, a second transistor, and a first contact structure. The first transistor and the second transistor are disposed on the substrate. The first transistor includes a plurality of first semiconductor channel layers, a first source/drain structure, and a second source/drain structure. The first semiconductor channel layers are stacked in a vertical direction and separated from one another. The first source/drain structure and the second source/drain structure are disposed at two opposite sides of each of the first semiconductor channel layers in a horizontal direction respectively. The first source/drain structure and the second source/drain structure are connected with the first semiconductor channel layers respectively. The second transistor includes a plurality of second semiconductor channel layers, a third source/drain structure, and a fourth source/drain structure. The second semiconductor channel layers are disposed above the first semiconductor channel layers. The second semiconductor channel layers are stacked in the vertical direction and separated from one another. The third source/drain structure and the fourth source/drain structure are disposed at two opposite sides of each of the second semiconductor channel layers in the horizontal direction respectively. The third source/drain structure and the fourth source/drain structure are connected with the second semiconductor channel layers respectively. The first contact structure penetrates through the third source/drain structure in the vertical direction. The first source/drain structure is electrically connected with the third source/drain structure via the first contact structure, and a part of the first source/drain structure is disposed between the substrate and the first contact structure in the vertical direction.

A manufacturing method of a semiconductor device is provided in an embodiment of the present invention. The manufacturing method includes the following steps. A first transistor and a second transistor are formed on a substrate. The first transistor includes a plurality of first semiconductor channel layers, a first source/drain structure, and a second source/drain structure. The first semiconductor channel layers are stacked in a vertical direction and separated from one another. The first source/drain structure and the second source/drain structure are disposed at two opposite sides of each of the first semiconductor channel layers in a horizontal direction respectively. The first source/drain structure and the second source/drain structure are connected with the first semiconductor channel layers respectively. The second transistor includes a plurality of second semiconductor channel layers, a third source/drain structure, and a fourth source/drain structure. The second semiconductor channel layers are disposed above the first semiconductor channel layers. The second semiconductor channel layers are stacked in the vertical direction and separated from one another. The third source/drain structure and the fourth source/drain structure are disposed at two opposite sides of each of the second semiconductor channel layers in the horizontal direction respectively. The third source/drain structure and the fourth source/drain structure are connected with the second semiconductor channel layers respectively. Subsequently, a first contact structure is formed penetrating through the third source/drain structure in the vertical direction. The first source/drain structure is electrically connected with the third source/drain structure via the first contact structure, and a part of the first source/drain structure is disposed between the substrate and the first contact structure in the vertical direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-12 are schematic drawings illustrating a manufacturing method of the semiconductor device according to the first embodiment of the present invention, wherein FIG. 4 is a cross-sectional schematic drawing of FIG. 3 in another direction, FIG. 5 is a schematic drawing in a step subsequent to FIG. 3, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, and FIG. 12 is a schematic drawing in a step subsequent to FIG. 11.

FIG. 14 and FIG. 15 are schematic drawings illustrating a manufacturing method of the semiconductor device according to the second embodiment of the present invention, wherein FIG. 15 is a schematic drawing in a step subsequent to FIG. 14.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
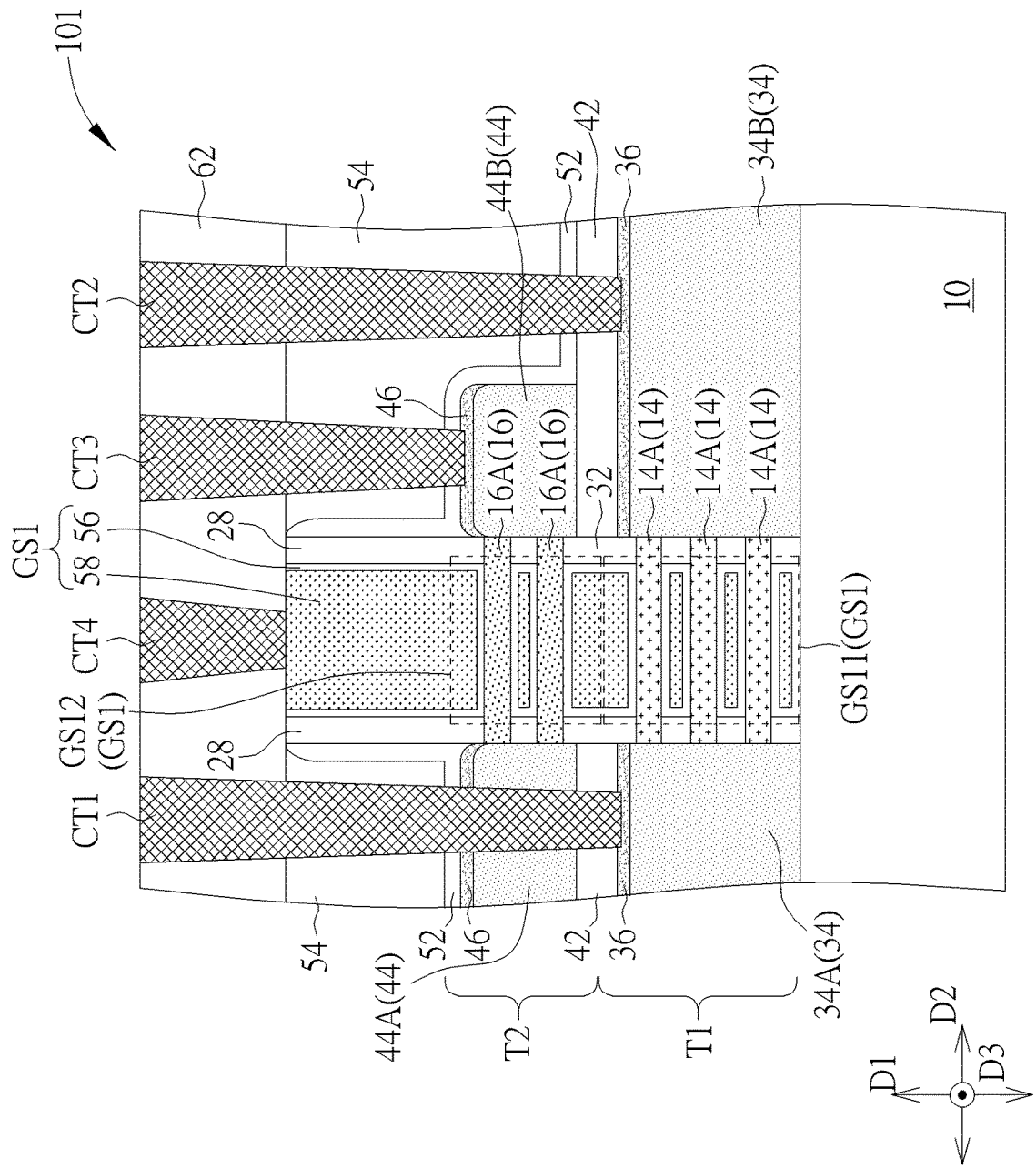
FIG. 1 is a schematic drawing illustrating a semiconductor device according to a first embodiment of the present invention.

Please refer to FIG. 1. FIG. 1 is a schematic drawing illustrating a semiconductor device according to a first embodiment of the present invention. As shown in FIG. 1, a semiconductor device 101 includes a substrate 10, a first transistor T1, a second transistor T2, and a first contact structure (such as a contact structure CT1 shown in FIG. 1). The first transistor T1 and the second transistor T2 are disposed on the substrate 10. The first transistor T1 includes a plurality of first semiconductor channel layers 14A, a first source/drain structure 34A, and a second source/drain structure 34B. The first semiconductor channel layers 14A are stacked in a vertical direction (such as a first direction D1 shown in FIG. 1) and separated from one another. The first source/drain structure 34A and the second source/drain structure 34B are disposed at two opposite sides of each of the first semiconductor channel layers 14A in a horizontal direction (such as a second direction D2 shown in FIG. 1), respectively. The first source/drain structure 34A and the second source/drain structure 34B are connected with the first semiconductor channel layers 14A, respectively. The second transistor T2 includes a plurality of second semiconductor channel layers 16A, a third source/drain structure 44A, and a fourth source/drain structure 44B. The second semiconductor channel layers 16A are disposed above the first semiconductor channel layers 14A. The second semiconductor channel layers 16A are stacked in the first direction D1 and separated from one another. The third source/drain structure 44A and the fourth source/drain structure 44B are disposed at two opposite sides of each of the second semiconductor channel layers 16A in the second direction D2, respectively. The third source/drain structure 44A and the fourth source/drain structure 44B are connected with the second semiconductor channel layers 16A, respectively. The contact structure CT1 penetrates through the third source/drain structure 44A in the first direction D1. The first source/drain structure 34A is electrically connected with the third source/drain structure 44A via the contact structure CT1, and a part of the first source/drain structure 34A is disposed between the substrate 10 and the contact structure CT1 in the first direction D1.

In some embodiments, the first direction D1 described above may be regarded as a thickness direction of the substrate 10, and the substrate 10 may have a top surface and a bottom surface opposite to the top surface in the first direction D1. The first transistor T1, the second transistor T2, and the contact structure CT1 may be disposed at a side of the top surface of the substrate 10, but not limited thereto. In addition, horizontal directions (such as the second direction D2 and a third direction D3 shown in FIG. 1) substantially orthogonal to the first direction D1 may be substantially parallel with the top surface and/or the bottom surface of the substrate 10, but not limited thereto. Additionally, in this description, a distance between the substrate 10 and a relatively higher location and/or a relatively higher part in the first direction D1 is greater than a distance between the substrate 10 and a relatively lower location and/or a relatively lower part in the first direction D1. The bottom or a lower portion of each component may be closer to the substrate 10 in the first direction D1 than the top or upper portion of this component. Another component disposed above a specific component may be regarded as being relatively far from the substrate 10 in the first direction D1, and another component disposed under a specific component may be regarded as being relatively closer to the substrate 10 in the first direction D1.

In some embodiments, at least a part of the first transistor T1 may be disposed between the substrate 10 and the second transistor T2 in the first direction D1, at least a part of the first source/drain structure 34A may be disposed between the substrate 10 and the third source/drain structure 44A in the first direction D1, at least a part of the second source/drain structure 34B may be disposed between the substrate 10 and the fourth source/drain structure 44B in the first direction D1, and at least a part of each of the first semiconductor channel layers 14A may be disposed between the substrate 10 and the second semiconductor channel layers 16A. In other words, the first transistor T1 and the second transistor T2 may at least partially overlap in the first direction D1, the first source/drain structure 34A and the third source/drain structure 44A may at least partially overlap in the first direction D1, the second source/drain structure 34B and the fourth source/drain structure 44B may at least partially overlap in the first direction D1, and each of the first semiconductor channel layers 14A and each of the second semiconductor channel layers 16A may at least partially overlap in the first direction D1.

In some embodiments, the semiconductor device 101 may include a first gate structure GS1 disposed on the substrate 10, and the first gate structure GS1 may be shared by the first transistor T1 and the second transistor T2. For example, the first transistor T1 may further include a first portion GS11 of the first gate structure GS1, and the second transistor T2 may further include a second portion GS12 of the first gate structure GS1. The first portion GS11 of the first gate structure GS1 may encompass each of the first semiconductor channel layers 14A, and the second portion GS12 of the first gate structure GS1 may encompass each of the second semiconductor channel layers 16A. The first portion GS11 of the first gate structure GS1 may be directly connected with the second portion GS12 of the first gate structure GS1, and the first portion GS11 of the first gate structure GS1 may be disposed between the second portion GS12 of the first gate structure GS1 and the substrate 10 in the first direction D1. Therefore, the first transistor T1 and the second transistor T2 may be regarded as a gate-all-around (GAA) transistor structure, respectively, but not limited thereto. In some embodiments, the first gate structure GS1 may include a gate dielectric layer 56 and a gate material layer 58, but not limited thereto. In the first portion GS11 of the first gate structure GS1, the gate dielectric layer 56 may be disposed between the gate material layer 58 and each of the first semiconductor channel layers 14A. In the second portion GS12 of the first gate structure GS1, the gate dielectric layer 56 may be disposed between the gate material layer 58 and each of the second semiconductor channel layers 16A.

In some embodiments, the semiconductor device 101 may further include a dielectric layer 42 disposed on the substrate 10. A part of the dielectric layer 42 may be disposed between the first source/drain structure 34A and the third source/drain structure 44A in the first direction D1 for separating the first source/drain structure 34A from the third source/drain structure 44A, and the contact structure CT1 may further penetrate through the dielectric layer 42 in the first direction D1.

In addition, another part of the dielectric layer 42 may be disposed between the second source/drain structure 34B and the fourth source/drain structure 44B in the first direction D1 for separating the second source/drain structure 34B from the fourth source/drain structure 44B. Additionally, in some embodiments, the semiconductor device 101 may further include a first metal silicide layer 36 and a second metal silicide layer 46. A part of the first metal silicide layer 36 may be disposed between the dielectric layer 42 and the first source/drain structure 34A in the first direction D1, another part of the first metal silicide layer 36 may be disposed between the dielectric layer 42 and the second source/drain structure 34B in the first direction D1, and the first metal silicide layer 36 may directly contact the first source/drain structure 34A and the second source/drain structure 34B, but not limited thereto. Additionally, the second metal silicide layer 46 may be disposed on and directly contact the third source/drain structure 44A and the fourth source/drain structure 44B, the third source/drain structure 44A may be disposed between the second metal silicide layer 46 and the substrate 10 in the first direction D1, and the fourth source/drain structure 44B may be disposed between the second metal silicide layer 46 and the substrate 10 in the first direction D1, but not limited thereto. In some embodiments, the contact structure CT1 may directly contact the first metal silicide layer 36 for being electrically connected with the first source/drain structure 34A via the first metal silicide layer 36. Accordingly, in some embodiments, the contact structure CT1 may not contact the first source/drain structure 34A directly, and a part of the first metal silicide layer 36 may be disposed between the contact structure CT1 and the first source/drain structure 34A in the first direction D1, but not limited thereto. The damage generated by the contact structure CT1 and/or related manufacturing processes for forming the contact structure CT1 to the first source/drain structure 34A and the substrate 10 may be avoided because the contact structure CT1 does not penetrate through the first source/drain structure 34A, and it is beneficial to the electrical performance of the first transistor T1 and the integrated electrical performance of the semiconductor device.

In some embodiments, the semiconductor device 101 may further include a contact structure CT2, a contact structure CT3, and a contact structure CT4 disposed corresponding to the second source/drain structure 34B, the fourth source/drain structure 44B, and the first gate structure GS1, respectively. The contact structure CT2 may be disposed on and electrically connected with the second source/drain structure 34B, the contact structure CT3 may be disposed on and electrically connected with the fourth source/drain structure 44B, and the contact structure CT4 may be disposed on and electrically connected with the first gate structure GS1. In some embodiments, the contact structure CT1, the contact structure CT2, the contact structure CT3, and the contact structure CT4 may be electrically separated from one another, but not limited thereto. Additionally, the fourth source/drain structure 44B may overlap a portion of the second source/drain structure 34B in the first direction D1, and the contact structure CT2 may be disposed on another part of the second source/drain structure 34B without overlapping the fourth source/drain structure 44B in the first direction D1.

In some embodiments, the semiconductor device 101 may further include a spacer 28, a spacer 32, an etching stop layer 52, a dielectric layer 54, and a dielectric layer 62. The spacer 32 may be disposed on sidewalls of a relatively lower portion of the first gate structure GS1 (such as the first portion GS11 and a part of the second portion GS12 described above), and the spacer 28 may be disposed on sidewalls of a relatively upper portion of the first gate structure GS1. Therefore, in some embodiments, a part of the spacer 32 may be disposed between the first gate structure GS1 and the first source/drain structure 34A in the second direction D2 or be disposed between the first gate structure GS1 and the second source/drain structure 34B in the second direction D2, and another part of the spacer 32 may be disposed between the first gate structure GS1 and the third source/drain structure 44A in the second direction D2 or be disposed between the first gate structure GS1 and the fourth source/drain structure 44B in the second direction D2. In addition, the etching stop layer 52 may be disposed on sidewalls of the spacer 28, the second metal silicide layer 46, the third source/drain structure 44A, the fourth source/drain structure 44B, and the dielectric layer 42. The dielectric layer 54 may be disposed on the etching stop layer 52, and the dielectric layer 62 may be disposed on the dielectric layer 54 and the first gate structure GS1.

In some embodiments, the contact structure CT1 may penetrate through the dielectric layer 62, the dielectric layer 54, the etching stop layer 52, the second metal silicide layer 46, the third source/drain structure 44A, and the dielectric layer 42 located above the first source/drain structure 34A in the first direction D1 for contacting and being electrically connected with the first metal silicide layer 36 located on the first source/drain structure 34A; the contact structure CT2 may penetrate through the dielectric layer 62, the dielectric layer 54, the etching stop layer 52, and the dielectric layer 42 located above the second source/drain structure 34B in the first direction D1 for contacting and being electrically connected with the first metal silicide layer 36 located on the second source/drain structure 34B; the contact structure CT3 may penetrate through the dielectric layer 62, the dielectric layer 54, and the etching stop layer 52 located above the fourth source/drain structure 44B in the first direction D1 for contacting and being electrically connected with the second metal silicide layer 46 located on the fourth source/drain structure 44B; and the contact structure CT4 may penetrate through the dielectric layer 62 located above the first gate structure GS1 in the first direction D1 for contacting and being electrically connected with the first gate structure GS1, but not limited thereto. In some embodiments, according to some process and/or design considerations, the contact structure may penetrate through the corresponding metal silicide layer and be partially disposed in the corresponding source/drain structure without penetrating through the corresponding source/drain structure. For example, the contact structure CT1 may further penetrate through the first metal silicide layer 36 and be partially disposed in the first source/drain structure 34A without penetrating through the first source/drain structure 34A for increasing the process window of the manufacturing process of forming the contact structure CT1.

Figure 2:
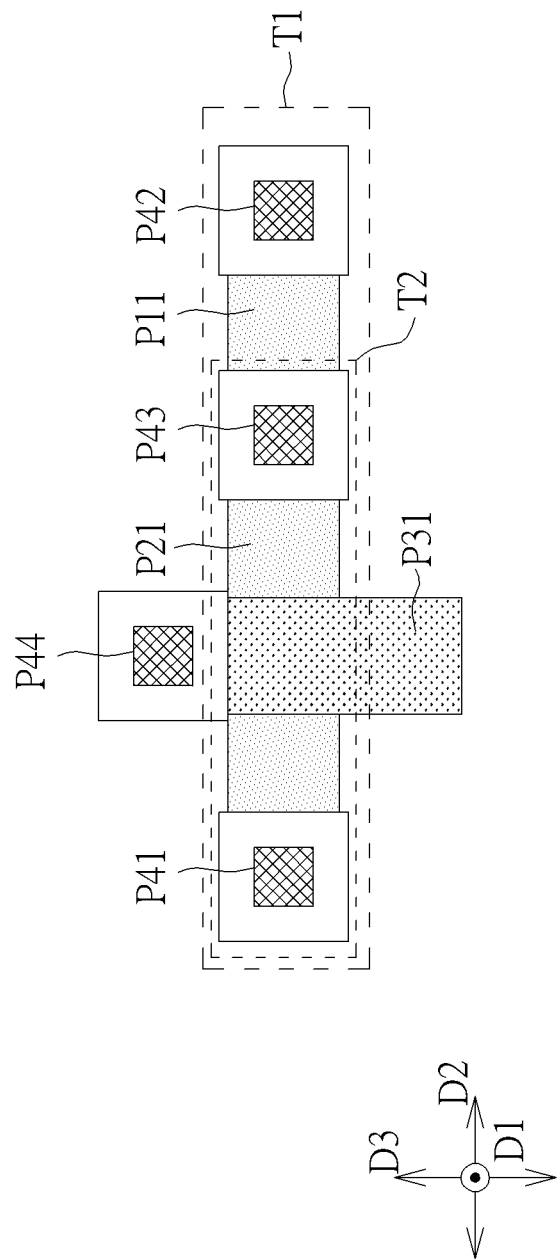
FIG. 2 is a schematic drawing illustrating a layout pattern of the semiconductor device according to the first embodiment of the present invention.

Please refer to FIG. 2 and FIG. 1. FIG. 2 is a schematic drawing illustrating a layout pattern of the semiconductor device 101 in this embodiment. As shown in FIG. 1 and FIG. 2, in some embodiments, an active region pattern P11 and an active region pattern P21 may be used to define locations of different active regions in the semiconductor device 101, a gate electrode pattern P31 may be used to define a location of the first gate structure GS1 and/or a location of a dummy gate structure (not shown in FIG. 1 and FIG. 2) corresponding to the first gate structure GS1, and a contact pattern P41, a contact pattern P42, a contact pattern P43, and a contact pattern P44 may be used to define a location of the contact structure CT1, a location of the contact structure CT2, a location of the contact structure CT3, and a location of the contact structure CT4, respectively, but not limited thereto. For example, the active region pattern P11 may correspond to the location of the first semiconductor channel layer 14A, the first source/drain structure 34A, and the second source/drain structure 34B in a top view of the semiconductor device, and the active region pattern P21 may correspond to the location of the second semiconductor channel layer 16A, the third source/drain structure 44A, and the fourth source/drain structure 44B in the top view of the semiconductor device. The area occupied by the semiconductor device 101 may be reduced by stacking the first transistor T1 and the second transistor T2 partially overlapping the first transistor T1, and it is beneficial to the density improvement of the transistors in related products.

In some embodiments, the first transistor T1 may be a transistor of a first conductivity type, the second transistor T2 may be a transistor of a second conductivity type, and the second conductivity type may be complementary to the first conductivity type. By electrically connecting the first source/drain structure 34A of the first transistor T1 with the third source/drain structure 44A of the second transistor T2, the semiconductor device 101 may be regarded as an inverter, but not limited thereto. For example, in some embodiments, the first transistor T1 may be a p-type transistor, and the second transistor T2 may be an n-type transistor. The contact structure CT1 may be electrically connected to an output terminal (such as output voltage, $V_{output}$), the contact structure CT2 may be electrically connected to power voltage (such as $V_{DD}$), the contact structure CT3 may be electrically connected to ground voltage (such as $V_{GND}$), and the contact structure CT4 may be electrically connected to an input terminal (such as input voltage, $V_{input}$), but not limited thereto. Additionally, in some embodiments, the number of the first semiconductor channel layers 14A in the first transistor T1 may be different from the number of the second semiconductor channel layers 16A in the second transistor T2 for modifying the electrical characteristics of the first transistor T1 and the electrical characteristics of the second transistor T2 respectively in order to meet the design requirements, especially when the conductivity type of the first transistor T1 is different from the conductivity type of the second transistor T2, but not limited thereto. For example, when the first transistor T1 is a p-type transistor and the second transistor T2 is an n-type transistor, the number of the first semiconductor channel layers 14A in the first transistor T1 (e.g. three first semiconductor channel layers 14A shown in FIG. 1) may be greater than the number of the second semiconductor channel layers 16A in the second transistor T2 (e.g. two second semiconductor channel layers 16A shown in FIG. 1), but not limited thereto.

In some embodiments, the substrate 10 may include a semiconductor substrate, such as a silicon substrate, an epitaxial silicon substrate, a silicon germanium substrate, a silicon carbide substrate, or a silicon-on-insulator (SOI) substrate, but not limited thereto. The first semiconductor channel layer 14A and the second semiconductor channel layer 16A may include a semiconductor material, respectively, such as silicon, silicon germanium, or other suitable semiconductor materials. In some embodiments, the material composition of each of the first semiconductor channel layers 14A may be identical to or different from the material composition of each of the second semiconductor channel layers 16A according to some design considerations. The first source/drain structure 34A, the second source/drain structure 34B, the third source/drain structure 44A, and the fourth source/drain structure 44B may include an epitaxial material, respectively, such as epitaxial silicon germanium (SiGe), epitaxial silicon phosphide (SiP), or other suitable epitaxial materials. The first metal silicide layer 36 and the second metal silicide layer 46 may include cobalt-silicide, nickel-silicide, or other suitable metal silicide materials, respectively. The dielectric layer 42, the etching stop layer 52, the dielectric layer 54, and the dielectric layer 62 may include silicon oxide, silicon nitride, silicon oxynitride, a low dielectric constant (low-k) dielectric material, or other suitable insulation materials, respectively. The gate dielectric layer 56 may include a high dielectric constant (high-k) dielectric material or other suitable dielectric materials. The high-k dielectric material described above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The gate material layer 58 may include a non-metallic electrically conductive material (such as doped polysilicon) or a metallic electrically conductive material, such as a metal gate structure formed with a work function layer and a low electrical resistivity layer stacked with each other, but not limited thereto. The work function layer described above may include titanium nitride (TiN), titanium carbide (TiC), tantalum nitride (TaN), tantalum carbide (TaC), tungsten carbide (WC), titanium trialuminide ($TiAl_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials. In some embodiments, the contact structure CT1, the contact structure CT2, the contact structure CT3, and the contact structure CT4 may include a barrier layer (not shown) and an electrically conductive material (not shown) located on the barrier layer, respectively, but not limited thereto. In some embodiments, each of the contact structures may be formed of other electrically conductive structures according to some design considerations. The barrier layer described above may include titanium nitride, tantalum nitride, or other suitable barrier materials, and the electrically conductive material described above may include a material having relatively lower electrical resistivity, such as tungsten, aluminum, copper, titanium aluminide, and titanium, but not limited thereto.

Figure 3:
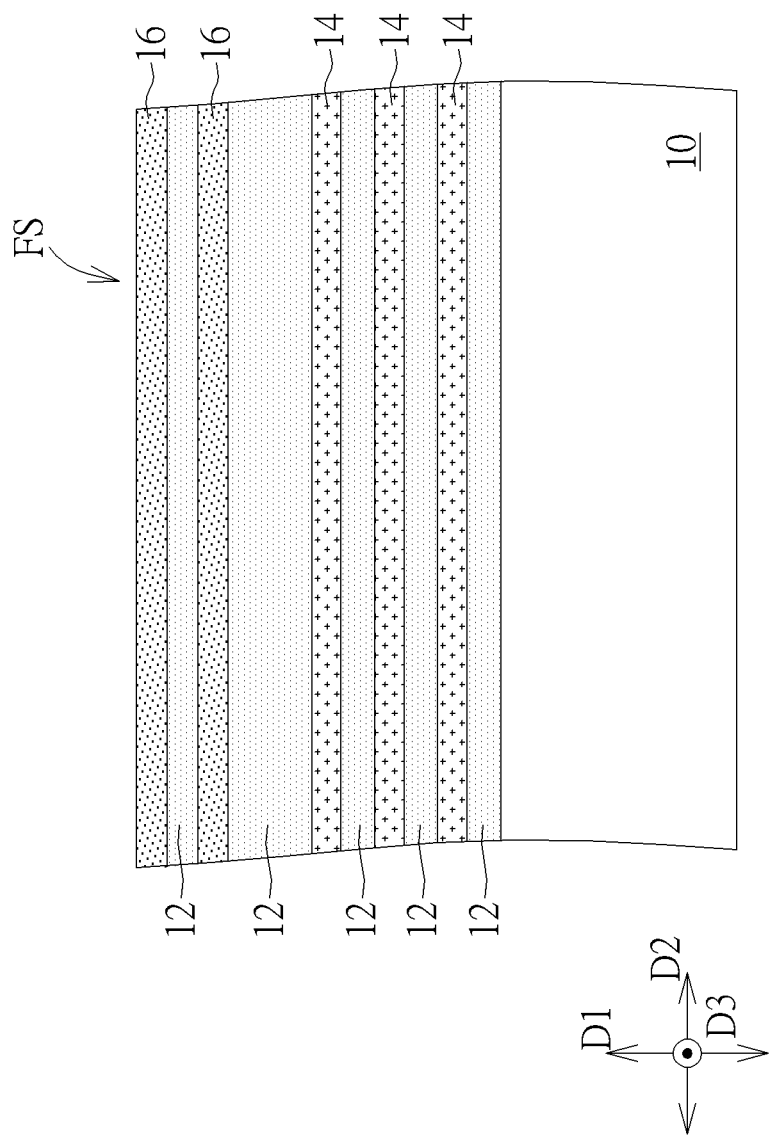
Figure 4:
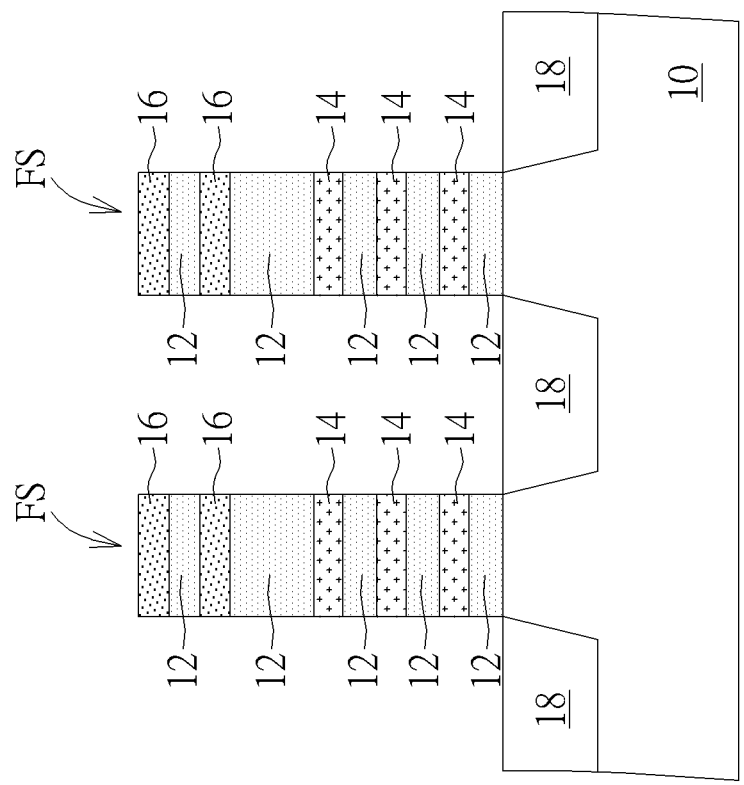
Figure 4:
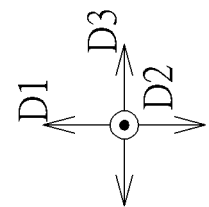
Figure 5:
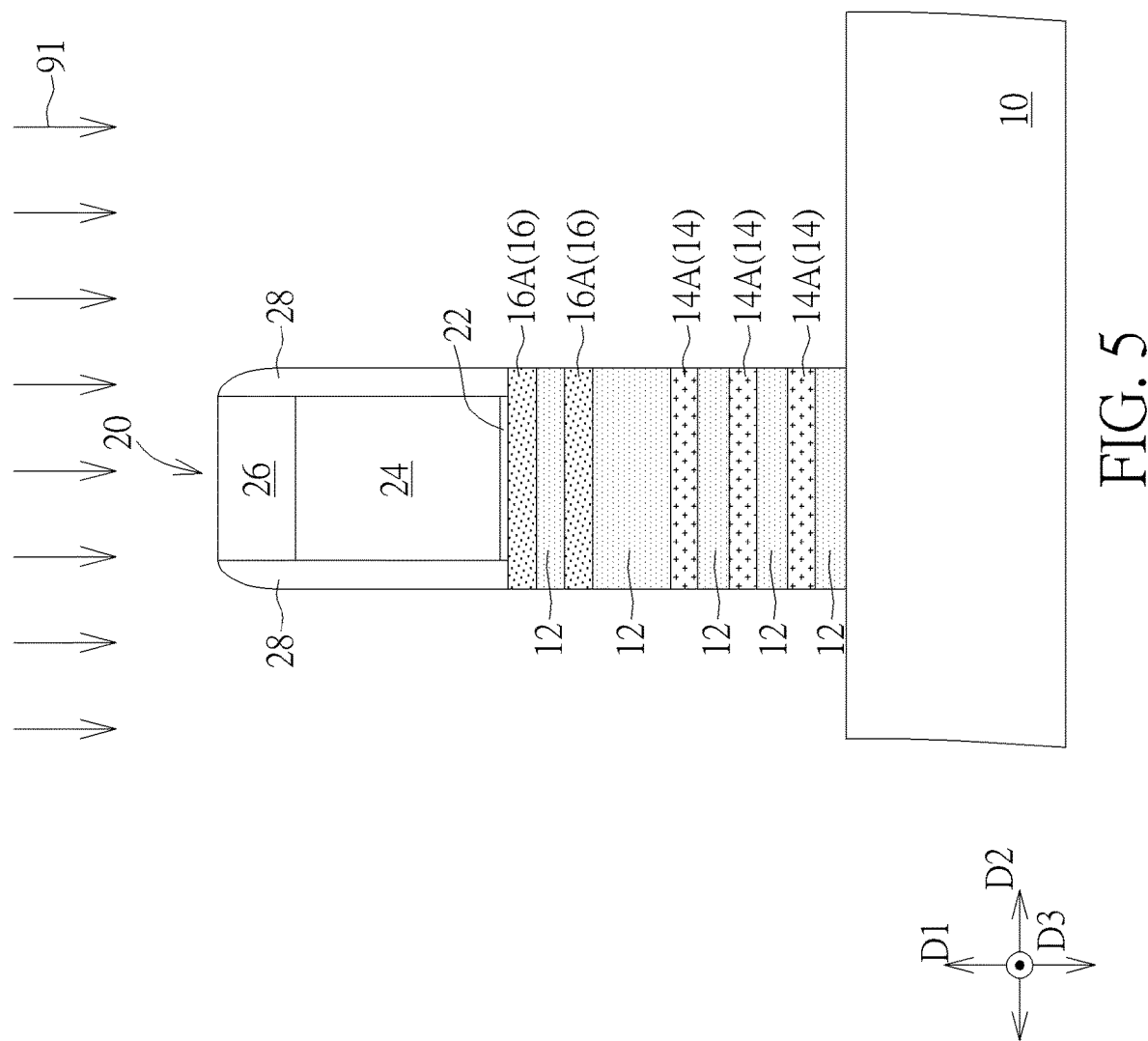
Figure 6:
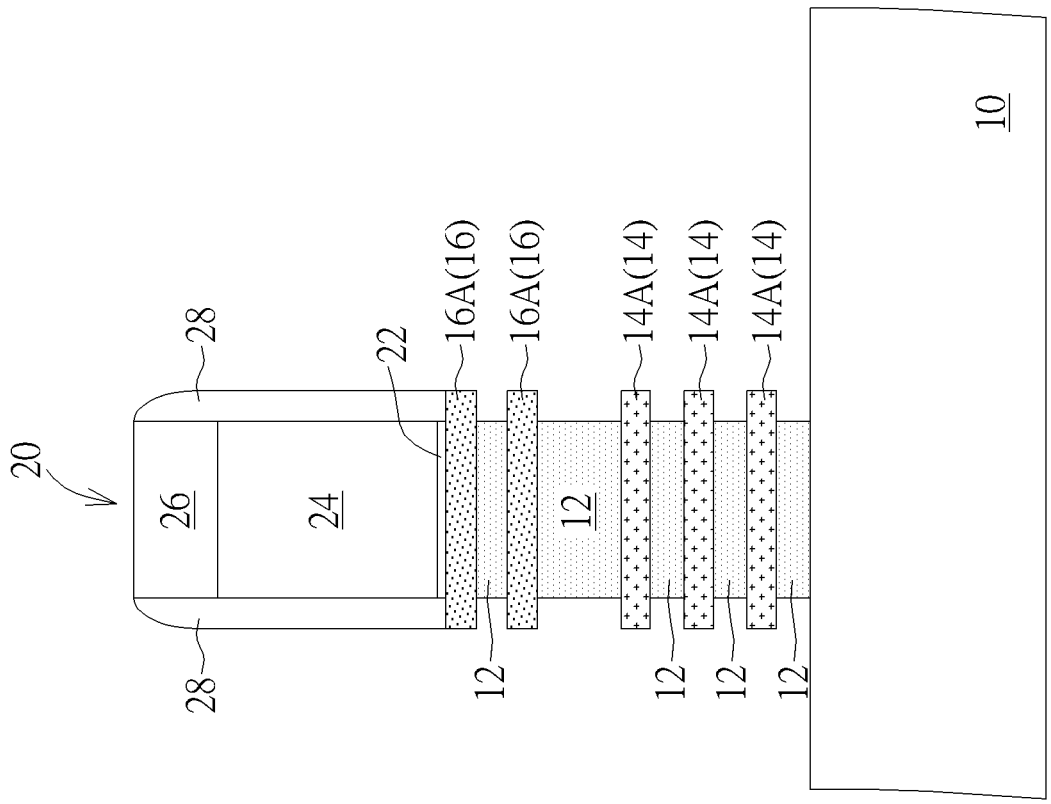
Figure 6:
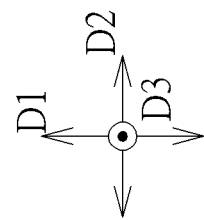
Figure 7:
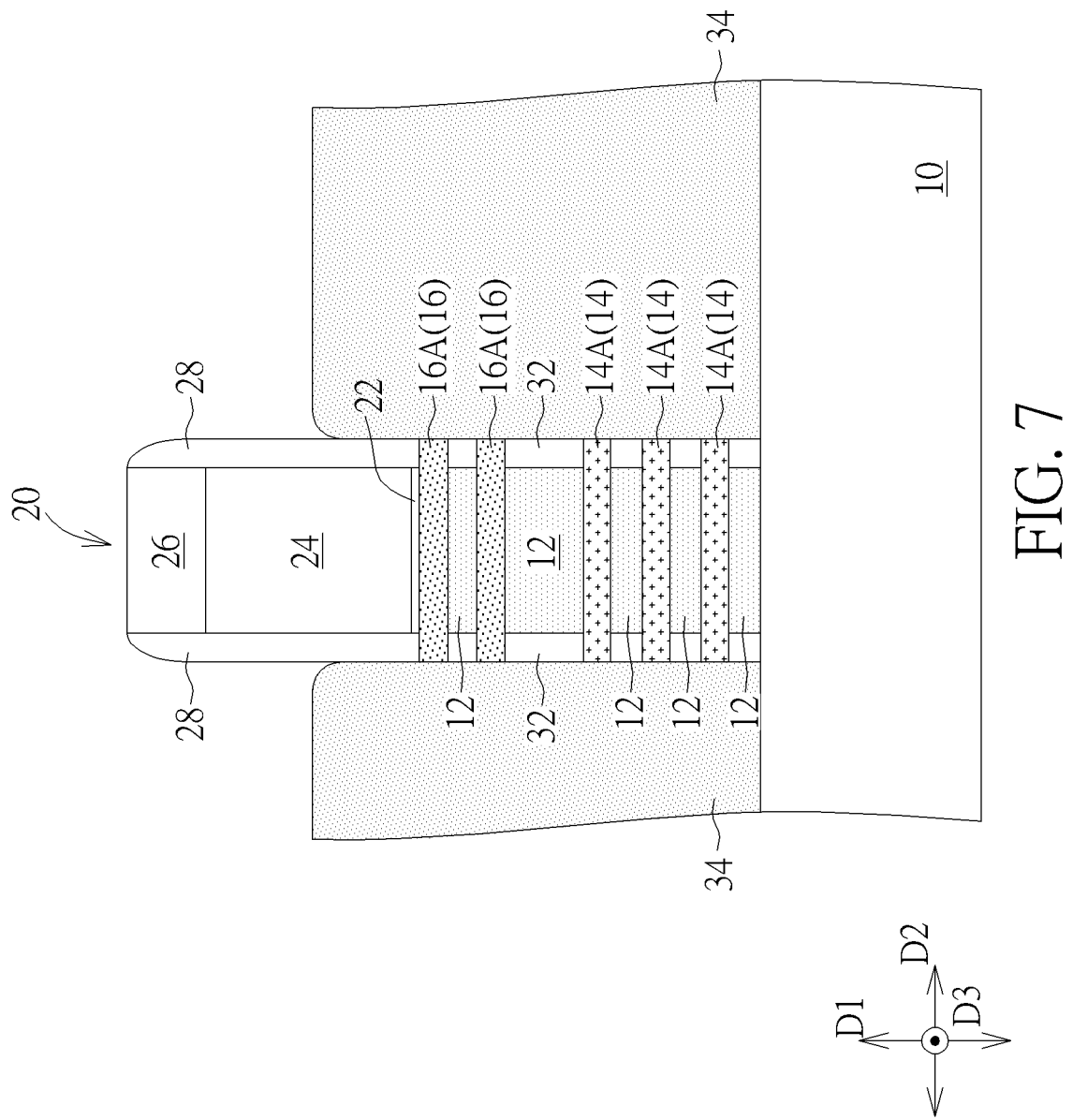
Figure 8:
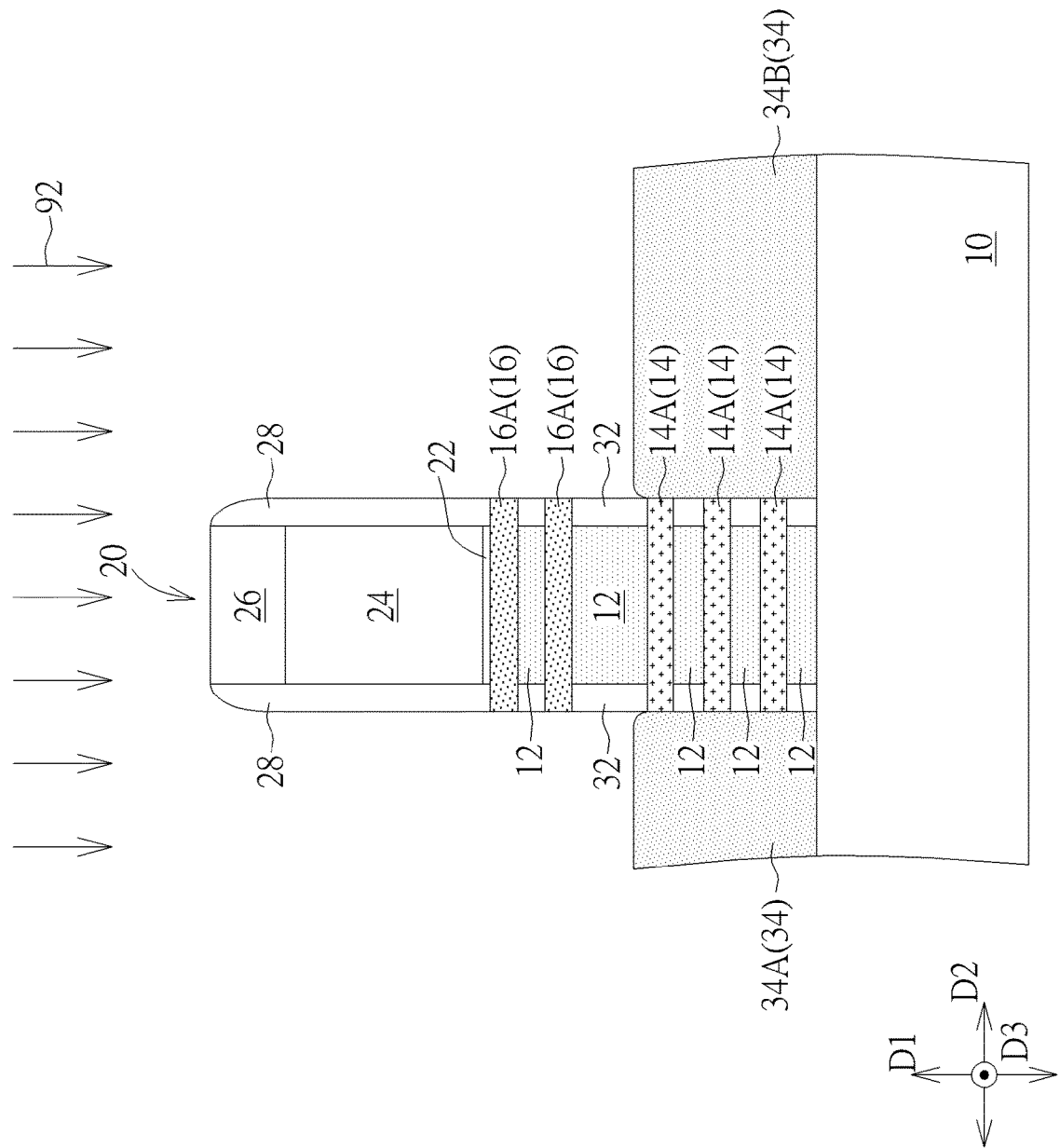
Figure 9:
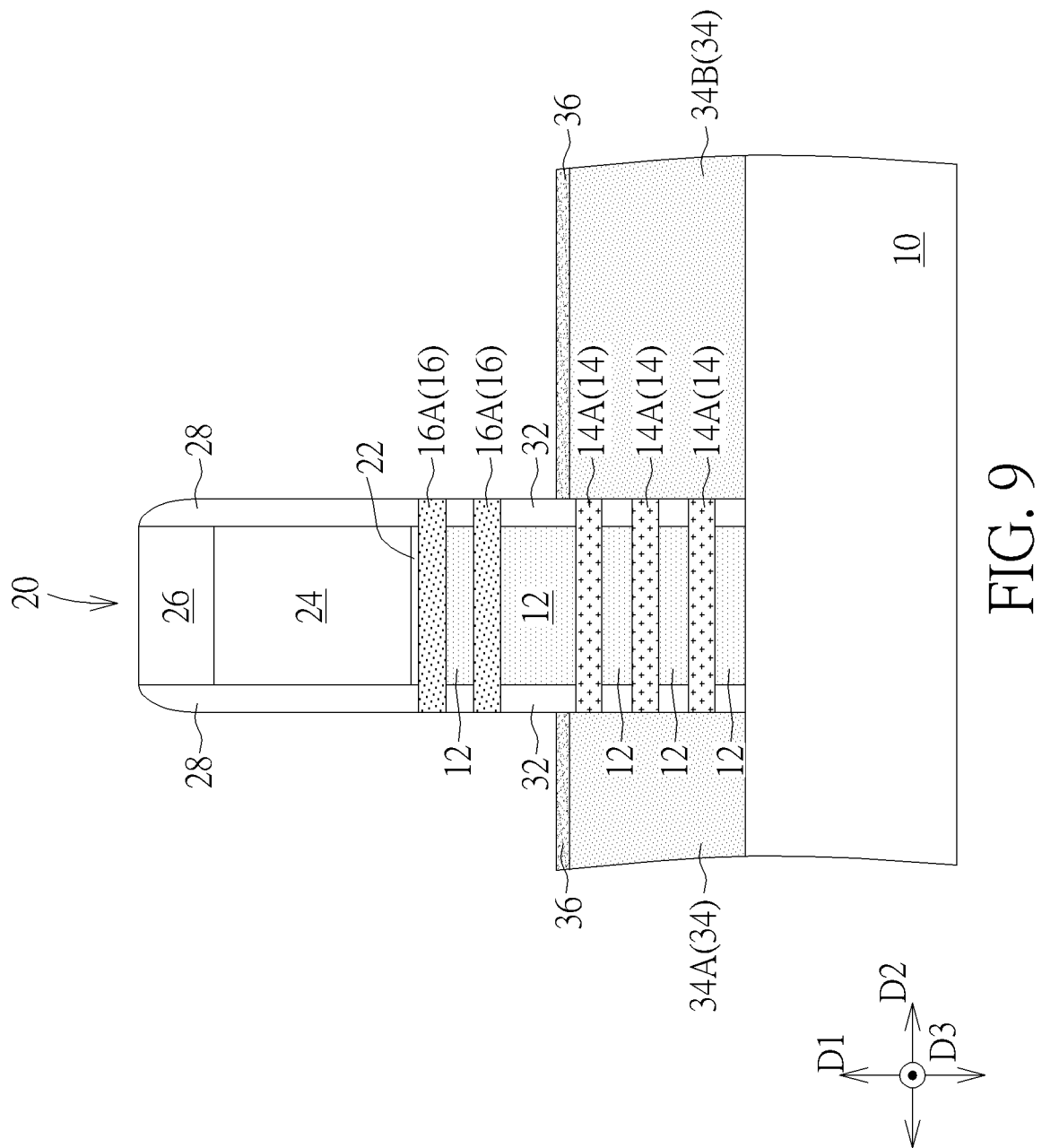
Figure 10:
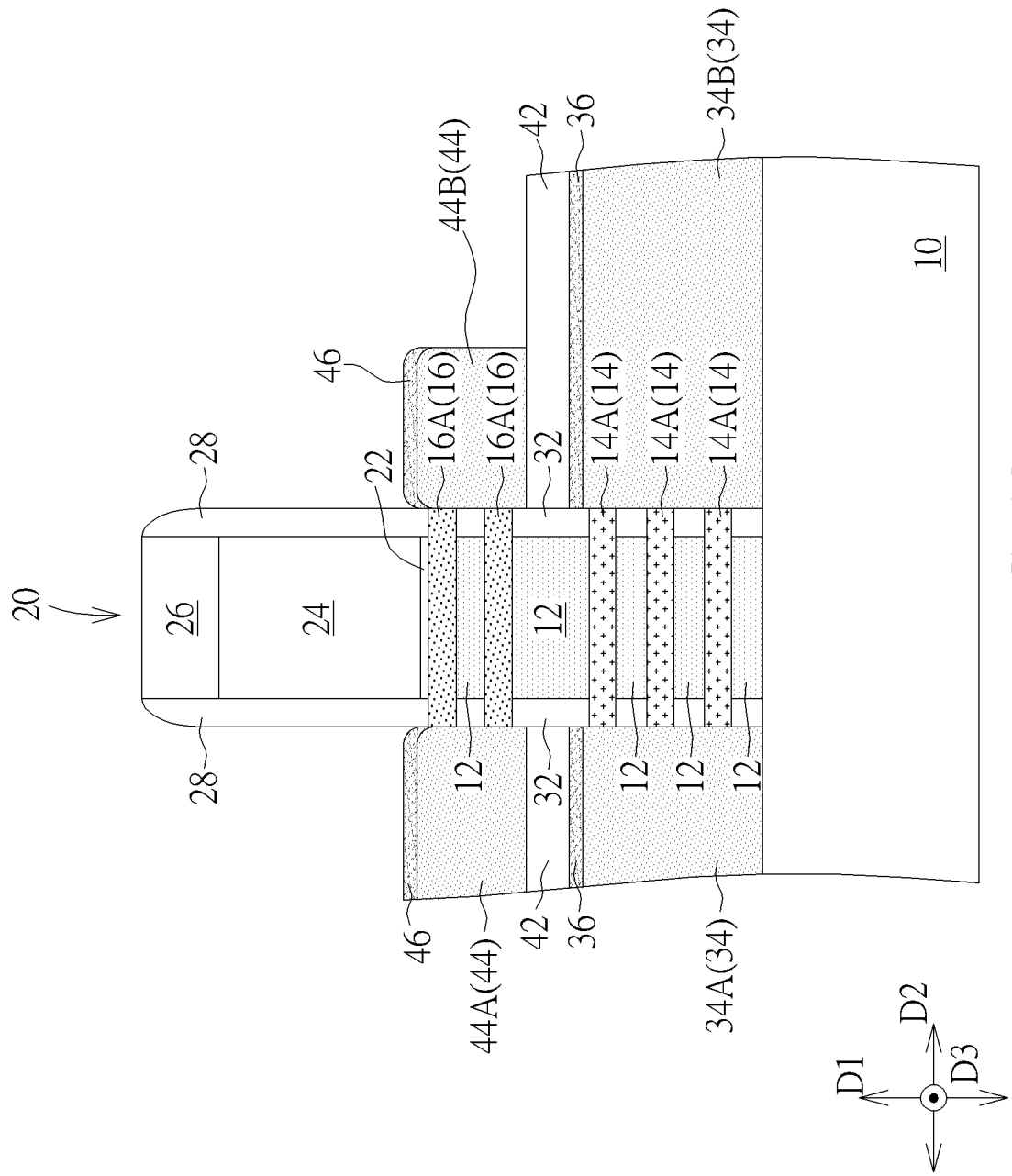
Figure 11:
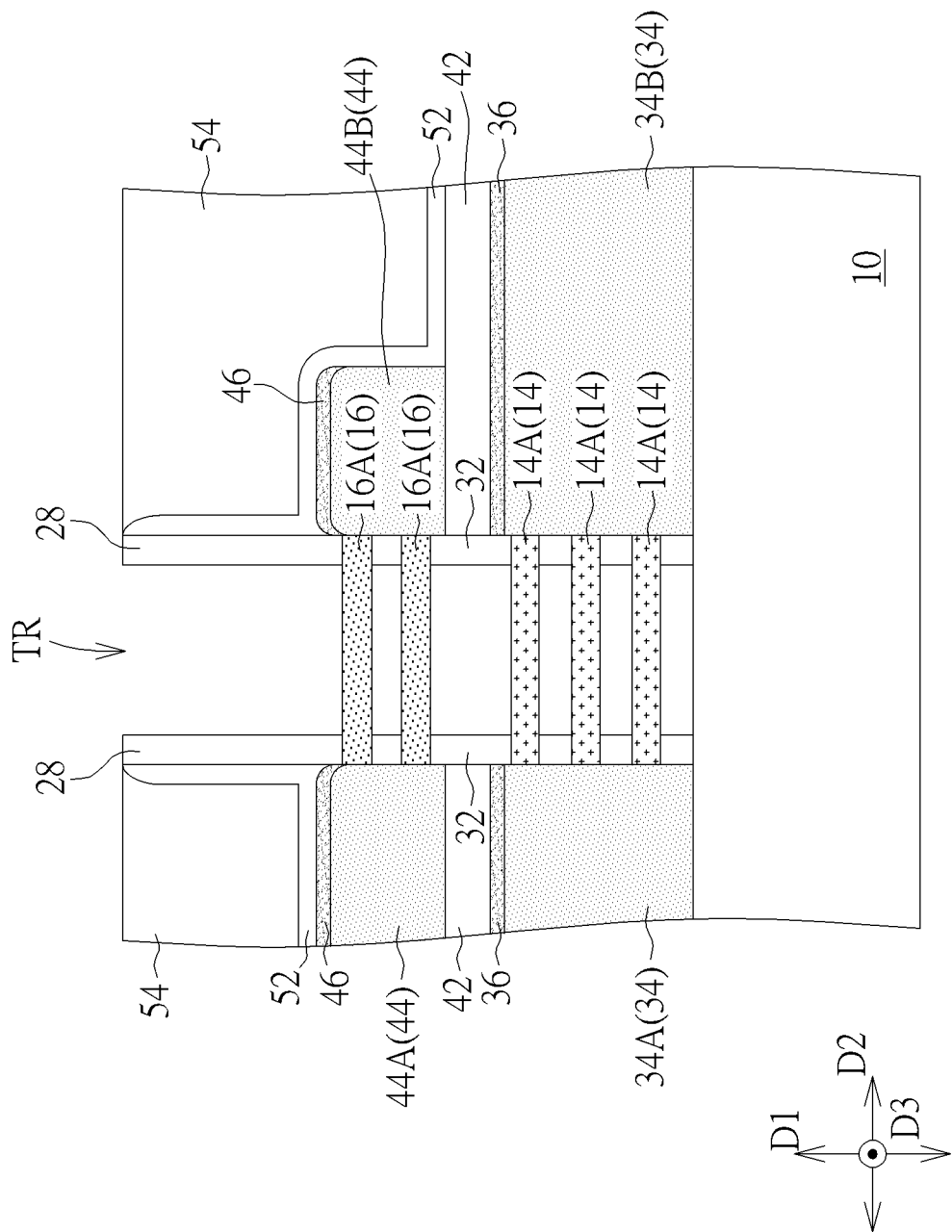
Figure 12:
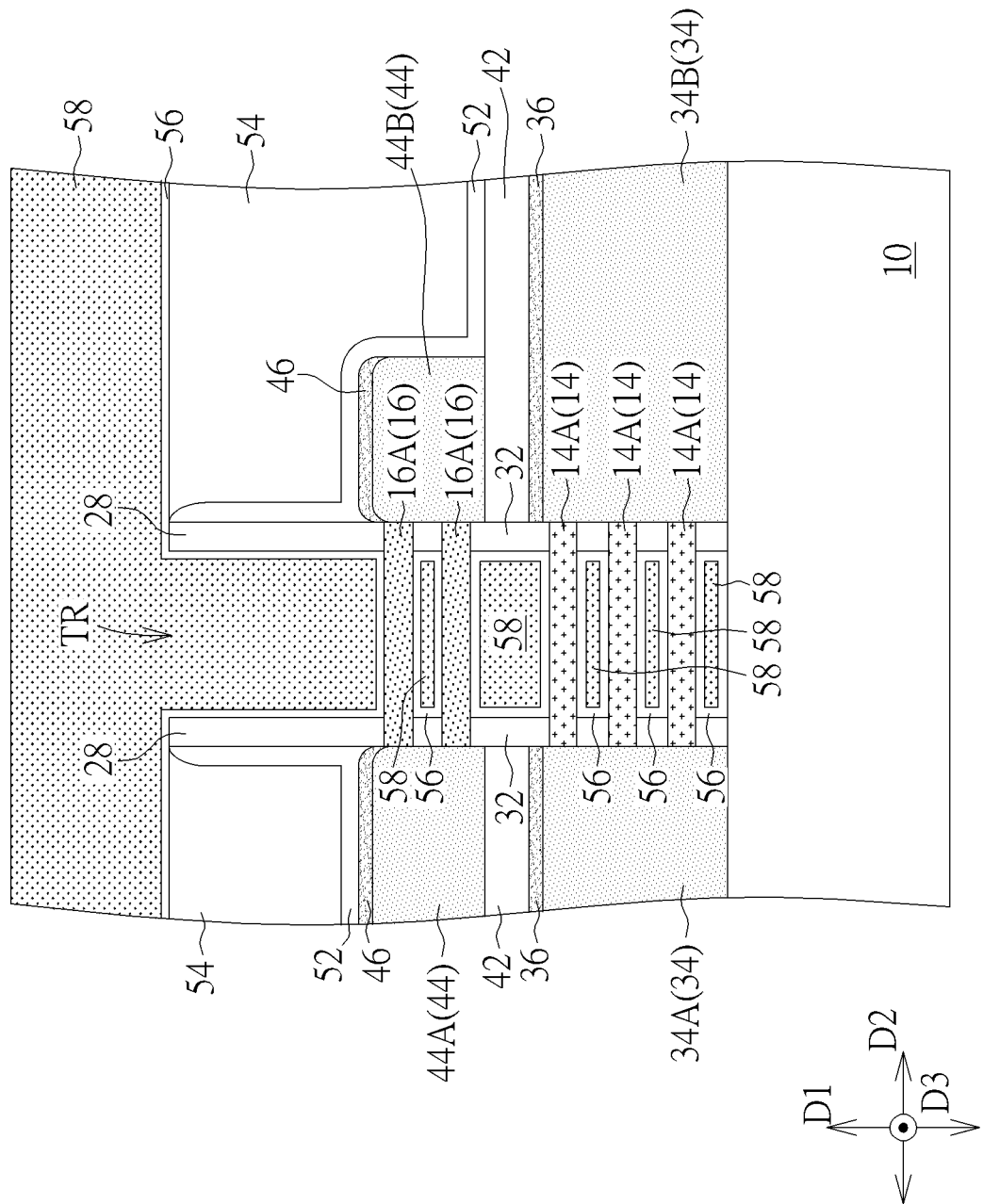

Please refer to FIGS. 3-12 and FIG. 1. FIGS. 3-12 are schematic drawings illustrating a manufacturing method of the semiconductor device according to the first embodiment of the present invention, wherein FIG. 4 is a cross-sectional schematic drawing of FIG. 3 in another direction, FIG. 5 is a schematic drawing in a step subsequent to FIG. 3, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, and FIG. 1 may be regarded as a schematic drawing in a step subsequent to FIG. 12. As shown in FIG. 1, a manufacturing method of the semiconductor device 101 may include the following steps. The first transistor T1 and the second transistor T2 are formed on the substrate 10. The first transistor T1 includes a plurality of the first semiconductor channel layers 14A, the first source/drain structure 34A, and the second source/drain structure 34B. The first semiconductor channel layers 14A are stacked in a vertical direction (such as the first direction D1) and separated from one another. The first source/drain structure 34A and the second source/drain structure 34B are disposed at two opposite sides of each of the first semiconductor channel layers 14A in a horizontal direction (such as the second direction D2), respectively. The first source/drain structure 34A and the second source/drain structure 34B are connected with the first semiconductor channel layers 14A, respectively. The second transistor T2 includes a plurality of the second semiconductor channel layers 16A, the third source/drain structure 44A, and the fourth source/drain structure 44B. The second semiconductor channel layers 16A are disposed above the first semiconductor channel layers 14A. The second semiconductor channel layers 16A are stacked in the first direction D1 and separated from one another. The third source/drain structure 44A and the fourth source/drain structure 44B are disposed at two opposite sides of each of the second semiconductor channel layers 16A in the second direction D2, respectively. The third source/drain structure 44A and the fourth source/drain structure 44B are connected with the second semiconductor channel layers 16A, respectively. Subsequently, the contact structure CT1 is formed. The contact structure CT1 penetrates through the third source/drain structure 44A in the first direction D1. The first source/drain structure 34A is electrically connected with the third source/drain structure 44A via the contact structure CT1, and a part of the first source/drain structure 34A is disposed between the substrate 10 and the contact structure CT1 in the first direction D1.

Specifically, the manufacturing method of the semiconductor device 101 in this embodiment may include but is not limited to the following steps. Firstly, as shown in FIG. 3 and FIG. 4, a stacked structure FS may be formed on the substrate 10, and the stacked structure FS includes a plurality of first semiconductor layers 14, a plurality of second semiconductor layers 16, and a sacrificial material 12. The first semiconductor layers 14 may be stacked in the first direction D1, and the second semiconductor layers 16 may be disposed above the first semiconductor layers 14 and stacked in the first direction D1. The sacrificial material 12 may be partly disposed between the first semiconductor layers 14, partly disposed between the second semiconductor layers 16, and partly disposed between the first semiconductor layers 14 and the second semiconductor layers 16. In other words, the sacrificial material 12 and the first semiconductor layers 14 may be alternately stacked in a lower portion of the stacked structure FS, and the sacrificial material 12 and the second semiconductor layers 16 may be alternately stacked in an upper portion of the stacked structure FS, but not limited thereto. In some embodiments, a plurality of the stacked structures FS may be formed on the substrate 10, each of the stacked structures FS may be substantially elongated in the second direction D2, and an isolation structure 18 may be disposed in the substrate 10 located between the stacked structures FS adjacent to each other, but not limited thereto. The isolation structure 18 may include a single layer or multiple layers of insulation materials, such as oxide insulation materials (silicon oxide and/or polysilazane, for example), or other suitable insulation materials.

In some embodiments, the material composition of the sacrificial material 12 may be different from the material composition of the first semiconductor layer 14 and the material composition of the second semiconductor layer 16 for providing required etching selectivity. For example, in some embodiments, the material of the first semiconductor layer 14 and the second semiconductor layer 16 may be a silicon semiconductor material, and the material of the sacrificial material 12 may be silicon germanium (SiGe) for constituting a superlattice epitaxial structure, but not limited thereto. In some embodiments, other material combinations may be used to form the stacked structures FS according to some design considerations. Additionally, in some embodiments, the sacrificial material 12, the first semiconductor layers 14, and the second semiconductor layers 16 may be formed globally and stacked on the substrate 10, and a patterning process may be performed to the sacrificial material 12, the first semiconductor layers 14, and the second semiconductor layers 16 for forming the stacked structures FS separated from one another, but not limited thereto. Subsequently, as shown in FIG. 3 and FIG. 5, a dummy gate structure 20 may be formed on the stacked structure FS, and a patterning process 91 may be performed to the stacked structure FS with the dummy gate structure 20 formed thereon. In some embodiments, the patterning process 91 may include an etching process or other suitable patterning approaches. A part of each of the first semiconductor layers 14 may be patterned to be one of the first semiconductor channel layers 14A by the patterning process 91, and a part of each of the second semiconductor layers 16 may be patterned to be one of the second semiconductor channel layers 16A by the patterning process 91. In some embodiments, each of the first semiconductor layers 14 in the stacked structure FS may be patterned to be the first semiconductor channel layer 14A by the patterning process 91, and each of the second semiconductor layers 16 in the stacked structure FS may be patterned to be the second semiconductor channel layer 16A by the patterning process 91, but not limited thereto.

In some embodiments, the dummy gate structure 20 may include a dielectric layer 22, a dummy gate material 24, and a gate cap layer 26, and the spacer 28 may be formed on sidewalls of the dummy gate structure 20. The dielectric layer 22 may include oxide or other suitable dielectric materials, the dummy gate material 24 may include polysilicon, amorphous silicon, or other suitable materials, and the gate cap layer 26 may include nitride, oxynitride, or other suitable insulation materials, but not limited thereto. In some embodiments, the patterning process 91 may be performed to the stacked structure FS with the dummy gate structure 20 and the spacer 28 as a mask, and the projection shape and/or the projection area of each of the first semiconductor channel layers 14A in the first direction D1 may be substantially the same as that of each of the second semiconductor channel layers 16A in the first direction D1 after the patterning process 91 accordingly, but not limited thereto. It is worth noting that the method of forming the first semiconductor channel layers 14A and the second semiconductor channel layers 16A in this embodiment may include but is not limited to the steps in FIGS. 3-5 described above. In some embodiments, the first semiconductor channel layers 14A and the second semiconductor channel layers 16A may be formed by other suitable approaches according to some process and/or design considerations.

Subsequently, as shown in FIG. 5 and FIG. 6, a recessing process may be performed to the sacrificial material 12 for reducing the length of the sacrificial material 12 in the second direction D2 and further exposing a part of each of the first semiconductor channel layers 14A and a part of each of the second semiconductor channel layers 16A. The recessing process described above may include an etching process having high etching selectivity between the sacrificial material 12, the first semiconductor channel layers 14A, and the second semiconductor channel layers 16A for reducing negative influence on the first semiconductor channel layers 14A and the second semiconductor channel layers 16A, but not limited thereto. As shown in FIG. 6 and FIG. 7, the spacer 32 may then be formed on the sidewalls of the sacrificial material 12, and an epitaxial material 34 may be formed on the substrate 10 after the step of forming the spacer 32. In some embodiments, an epitaxial growth process may be carried out from the substrate 10, an edge of each of the first semiconductor channel layers 14A, and/or an edge of each of the second semiconductor channel layers 16A for forming the epitaxial material 34, and the epitaxial material 34 may be connected with each of the first semiconductor channel layers 14A and each of the second semiconductor channel layers 16A accordingly, but not limited thereto. Subsequently, as shown in FIG. 7 and FIG. 8, a recessing process 92 may be performed to the epitaxial material 34 for removing a part of the epitaxial material 34 in order to partially expose each of the second semiconductor channel layers 16A and form the first source/drain structure 34A and the second source/drain structure 34B with the epitaxial material 34 remaining on the substrate 10. In other words, at least a part of the epitaxial material 34 may be etched to be the first source/drain structure 34A and the second source/drain structure 34B by the recessing process 92, but not limited thereto. It is worth noting that the method of forming the first source/drain structure 34A and the second source/drain structure 34B in this embodiment may include but is not limited to the steps in FIGS. 6-8 described above. In some embodiments, the first source/drain structure 34A and the second source/drain structure 34B may be formed by other suitable approaches according to some process and/or design considerations. For example, the dimension of the epitaxial material 34 at the time of formation may be controlled for directly forming the first source/drain structure 34A and the second source/drain structure 34B without performing the recessing process 92 described above, but not limited thereto.

Subsequently, as shown in FIG. 9, the first metal silicide layer 36 may be formed on the first source/drain structure 34A and the second source/drain structure 34B, respectively. As shown in FIG. 9 and FIG. 10, in some embodiments, the dielectric layer 42 may be formed on the first source/drain structure 34A and the second source/drain structure 34B after the step of forming the first metal silicide layer 36, a part of the first metal silicide layer 36 may be located between the first source/drain structure 34A and the dielectric layer 42, and another part of the first metal silicide layer 36 may be located between the second source/drain structure 34B and the dielectric layer 42 accordingly, but not limited thereto. Subsequently, the third source/drain structure 44A and the fourth source/drain structure 44B are formed on the dielectric layer 42. In some embodiments, an epitaxial material 44 may be formed by performing an epitaxial growth process from the exposed edges of each of the second semiconductor channel layers 16A, and the epitaxial material 44 may be directly connected with the second semiconductor channel layers 16A accordingly. The required third source/drain structure 44A and the required fourth source/drain structure 44B may be formed at two opposite sides of each of the second semiconductor channel layers 16A in the second direction D2 by controlling the formation of the epitaxial material 44 (such as controlling the process time for forming the epitaxial material 44). In some embodiments, a portion of the second source/drain structure 34B may not overlap the fourth source/drain structure 44B in the first direction D1 by removing a part of the fourth source/drain structure 44B, and the space for forming the contact structure corresponding to the second source/ drain structure 34B may be obtained accordingly, but not limited thereto. The second metal silicide layer 46 may then be formed on the third source/drain structure 44A and the fourth source/drain structure 44B. It is worth noting that the method of forming the third source/drain structure 44A and the fourth source/drain structure 44B in this embodiment may include but is not limited to the steps in FIG. 9 and FIG. 10 described above. In some embodiments, the third source/drain structure 44A and the fourth source/drain structure 44B may be formed by other suitable approaches according to some process and/or design considerations.

As shown in FIGS. 10-12 and FIG. 1, in some embodiments, the first gate structure GS1 may be formed by replacing the dummy gate structure 20 and the sacrificial material 12 with the gate dielectric layer 56 and the gate material layer 58. Specifically, as shown in FIG. 10 and FIG. 11, the etching stop layer 52 and the dielectric layer 54 may be formed after the step of forming the second metal silicide layer 46, and a planarization process may be performed for removing the gate cap layer 26, a part of the dielectric layer 54, and a part of the etching stop layer 52 and exposing the dummy gate structure 20. The planarization process described above may include a chemical mechanical polishing (CMP) process, an etching back process, or other suitable planarization approaches. After the planarization process described above, the exposed dummy gate structure 20 and the sacrificial material 12 may be removed for forming a trench TR. The trench TR may be surrounded by the spacer 28 and the spacer 32 in the horizontal directions, and each of the first semiconductor channel layers 14A and each of the second semiconductor channel layers 16A may be partly disposed in the trench TR. Subsequently, as shown in FIG. 12, the gate dielectric layer 56 and the gate material layer 58 may be formed sequentially, and the trench TR may be filled with a part of the gate dielectric layer 56 and a part of the gate material layer 58. As shown in FIG. 12 and FIG. 1, another planarization process may then be performed for removing the gate dielectric layer 56 and the gate material layer 58 outside the trench TR and forming the first gate structure GS1 in the trench TR. It is worth noting that the method of forming the first gate structure GS1 in this embodiment may include but is not limited to the steps in FIG. 10, FIG. 12, and FIG. 1 described above. In some embodiments, the first gate structure GS1 may be formed by other suitable approaches according to some process and/or design considerations.

Subsequently, as shown in FIG. 1, the dielectric layer 62, the contact structure CT1, the contact structure CT2, the contact structure CT3, and the contact structure CT4 may be formed after the step of forming the first gate structure GS1, and the semiconductor device 101 shown in FIG. 1 may be formed accordingly. In the manufacturing method of this embodiment, the first transistor T1 and the second transistor T2 stacked and partly overlapping may be formed, and the third source/drain structure 44A may be electrically connected with the first source/drain structure 34A via the contact structure CT1 penetrating through the third source/drain structure 44A for reducing the area occupied by the semiconductor device 101.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 13:
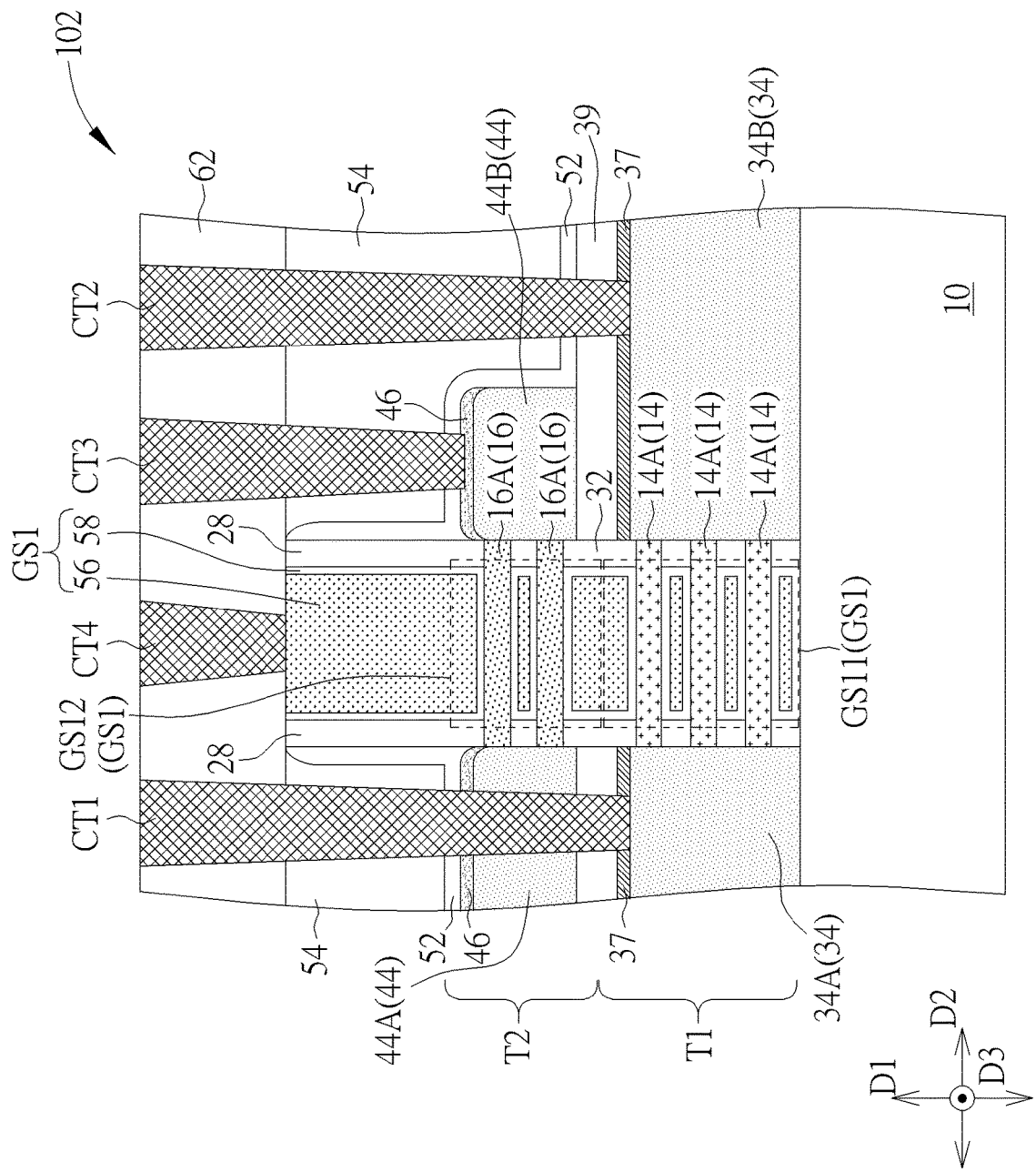
FIG. 13 is a schematic drawing illustrating a semiconductor device according to a second embodiment of the present invention.

Please refer to FIG. 13. FIG. 13 is a schematic drawing illustrating a semiconductor device 102 according to a second embodiment of the present invention. As shown in FIG. 13, the semiconductor device 102 may include a dielectric layer 39 and a silicon germanium layer 37 disposed on the substrate 10. The dielectric layer 39 may include an oxide dielectric material or other suitable dielectric materials. A part of the dielectric layer 39 may be disposed between the first source/drain structure 34A and the third source/drain structure 44A in the first direction D1 for separating the first source/drain structure 34A from the third source/drain structure 44A, and another part of the dielectric layer 39 may be disposed between the second source/drain structure 34B and the fourth source/drain structure 44B in the first direction D1 for separating the second source/drain structure 34B from the fourth source/drain structure 44B. In addition, a part of the silicon germanium layer 37 may be disposed between the dielectric layer 39 and the first source/drain structure 34A in the first direction, another part of the silicon germanium layer 37 may be disposed between the dielectric layer 39 and the second source/drain structure 34B in the first direction D1, and the silicon germanium layer 37 may directly contact the first source/drain structure 34A and the second source/drain structure 34B, but not limited thereto. In some embodiments, an atomic ratio of germanium in the silicon germanium layer 37 may be higher than an atomic ratio of germanium in the first source/drain structure 34A and an atomic ratio of germanium in the second source/drain structure 34B for enhancing the stress effect to the first semiconductor channel layers 14A in the first transistor T1, and the silicon germanium layer 37 may be used to enhance the electrical performance of the first transistor T1 accordingly, but not limited thereto. In some embodiments, the contact structure CT1 may penetrate through the dielectric layer 62, the dielectric layer 54, the etching stop layer 52, the second metal silicide layer 46, the third source/drain structure 44A, the dielectric layer 39, and the silicon germanium layer 37 located above the first source/drain structure 34A in the first direction D1 for contacting and being electrically connected with the first source/drain structure 34A and the silicon germanium layer 37, and the contact structure CT2 may penetrate through the dielectric layer 62, the dielectric layer 54, the etching stop layer 52, the dielectric layer 39, and the silicon germanium layer 37 located above the second source/drain structure 34B in the first direction D1 for contacting and being electrically connected with the second source/drain structure 34B and the silicon germanium layer 37, but not limited thereto.

Figure 14:
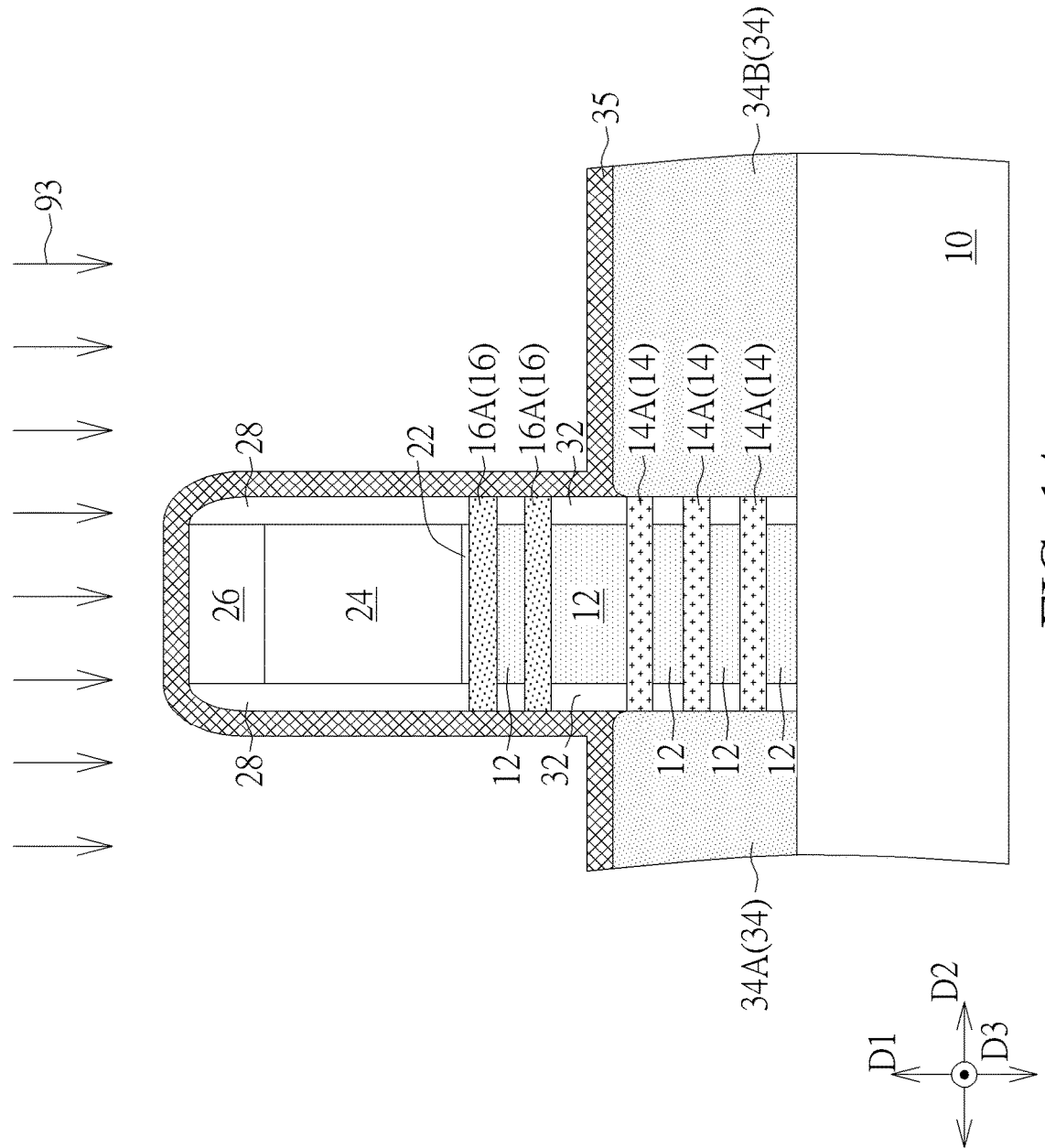
Figure 15:
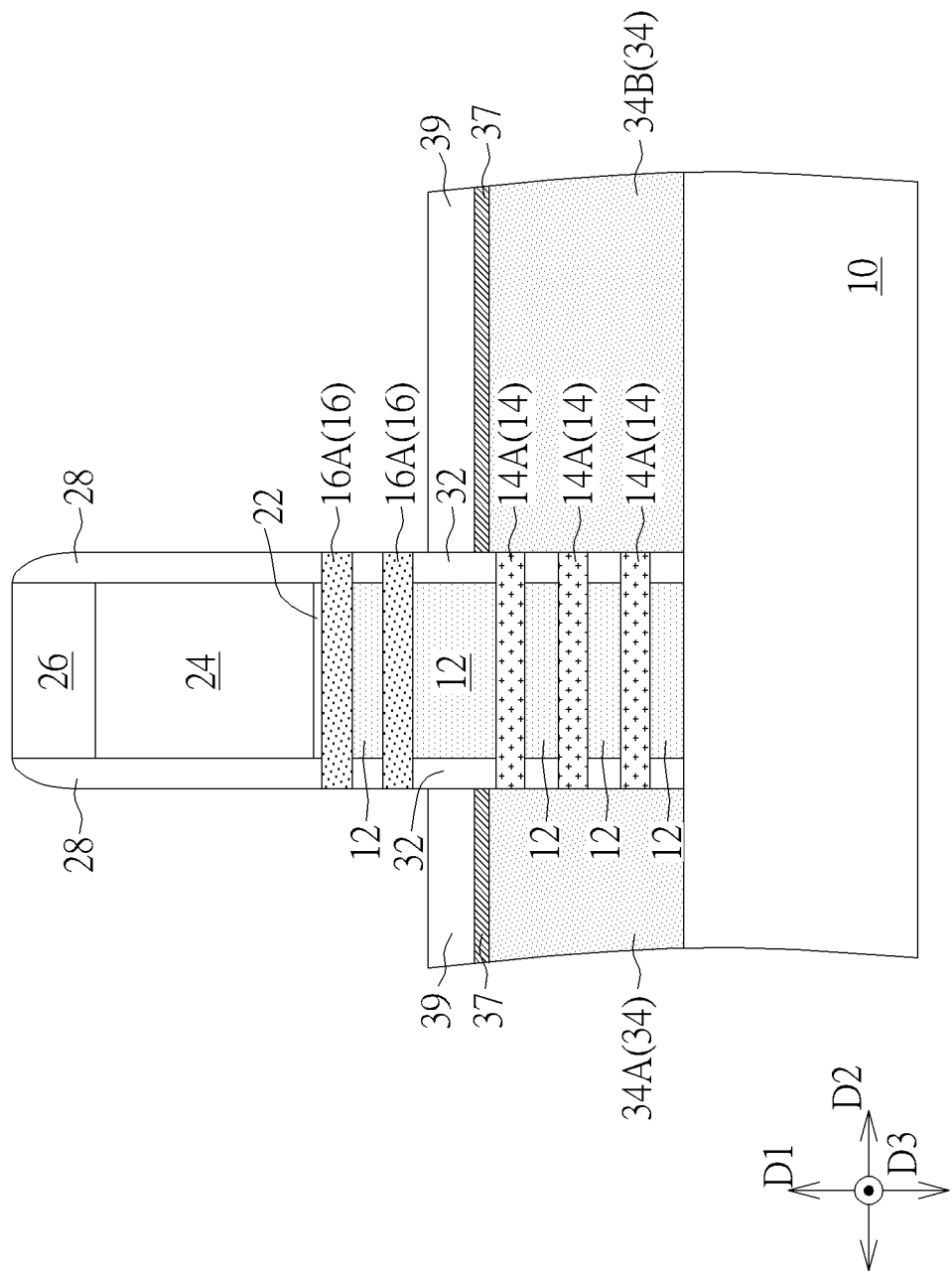

Please refer to FIGS. 13-15. FIG. 14 and FIG. 15 are schematic drawings illustrating a manufacturing method of the semiconductor device 102 according to the second embodiment of the present invention, wherein FIG. 15 is a schematic drawing in a step subsequent to FIG. 14, and FIG. 13 may be regarded as a schematic drawing in a step subsequent to FIG. 15. In some embodiments, the method of forming the dielectric layer 39 and the silicon germanium layer 37 may include but is not limited to the following steps. As shown in FIG. 14 and FIG. 15, a germanium oxide layer 35 may be formed on the first source/drain structure 34A and the second source/drain structure 34B. After the step of forming the germanium oxide layer 35, an oxidation process 93 may be performed to the germanium oxide layer 35, and an upper portion of the germanium oxide layer 35 may be converted into the dielectric layer 39 by the oxidation process 93. In addition, when the material of the first source/drain structure 34A and the second source/drain structure 34B includes silicon (such as epitaxial silicon germanium), a lower portion of the germanium oxide layer 35 and a portion of the first source/drain structure 34A may be converted into the silicon germanium layer 37 located between the dielectric layer 39 and the first source/drain structure 34A by the oxidation process 93, and another lower portion of the germanium oxide layer 35 and a portion of the second source/drain structure 34B may be converted into the silicon germanium layer 37 located between the dielectric layer 39 and the second source/drain structure 34B by the oxidation process 93, but not limited thereto. In some embodiments, the oxidation process 93 may be regarded as a condensation annealing process configured to make the silicon in the first source/drain structure 34A and the second source/drain structure 34B diffuse upwards for forming the dielectric layer 39 composed of silicon oxide and make the germanium in the germanium oxide layer 35 diffuse downwards for forming the silicon germanium layer 37 with relatively higher germanium concentration, but not limited thereto. In addition, after the oxidation process 93, the remaining germanium oxide layer 35 (such as the germanium oxide layer 35 formed on the gate cap layer 26, the spacer 28, the sidewall of the spacer 32, and the sidewall of the second semiconductor channel layer 16A) may be removed for avoiding the influence of the germanium oxide layer 35 on the subsequent process of forming the third source/drain structure 44A and the fourth source/drain structure 44B (as shown in FIG. 13).

Figure 16:
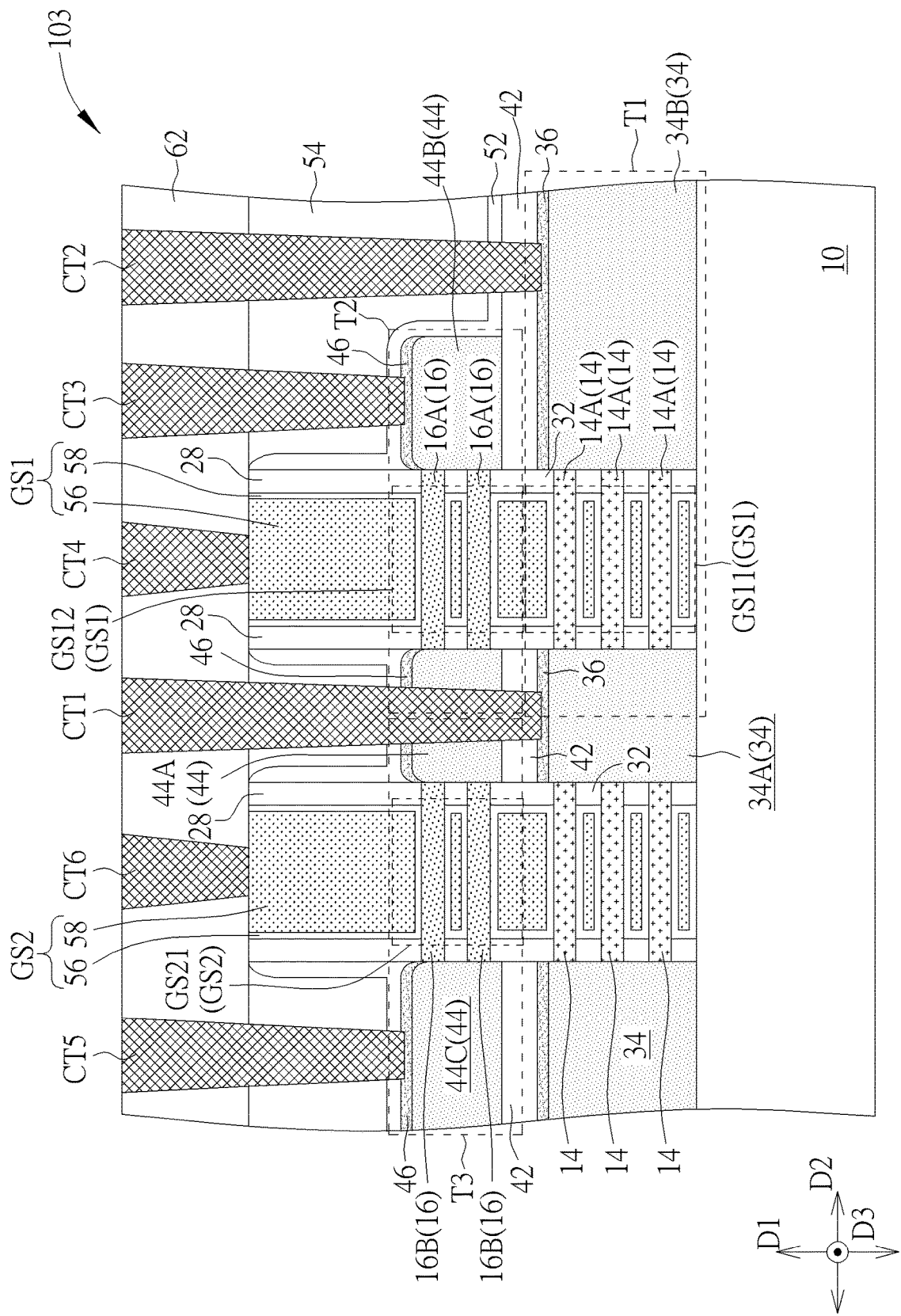
FIG. 16 is a schematic drawing illustrating a semiconductor device according to a third embodiment of the present invention.

Please refer to FIG. 16. FIG. 16 is a schematic drawing illustrating a semiconductor device 103 according to a third embodiment of the present invention. As shown in FIG. 16, the semiconductor device 103 may further include a plurality of third semiconductor channel layers 16B and a fifth source/drain structure 44C. The third semiconductor channel layers 16B and the fifth source/drain structure 44C are disposed on the substrate 10. The third semiconductor channel layers 16B may be stacked in the first direction D1, and the third source/drain structure 44A may be disposed between one of the second semiconductor channel layers 16A and one of the third semiconductor channel layers 16B in the second direction D2. In addition, the third semiconductor channel layers 16B may be disposed between the fifth source/drain structure 44C and the third source/drain structure 44A in the second direction D2, and the third semiconductor channel layers 16B, the fifth source/drain structure 44C, and the third source/drain structure 44A may constitute a portion of a third transistor T3. In other words, the third source/drain structure 44A may be shared by the second transistor T2 and the third transistor T3 for reducing the area occupied by the semiconductor device 103, but not limited thereto.

In some embodiments, the semiconductor device 103 may further include a second gate structure GS2, a contact structure CT5, and a contact structure CT6. In some embodiments, the second gate structure GS2 and the first gate structure GS1 may be formed concurrently by the same manufacturing process, and the second gate structure GS2 may include the gate dielectric layer 56 and the gate material layer 58 also. The second gate structure GS2 may encompass each of the third semiconductor channel layers 16B, and the spacer 28 and the spacer 32 may further disposed on sidewalls of the second gate structure GS2, respectively, but not limited thereto. In addition, a part of the second metal silicide layer 46 may be formed on the fifth source/drain structure 44C, the contact structure CT6 may penetrate through the dielectric layer 62 located above the second gate structure GS2 in the first direction D1 for contacting and being electrically connected with the second gate structure GS2, and the contact structure CT5 may penetrate through the dielectric layer 62, the dielectric layer 54, and the etching stop layer 52 located above the fifth source/drain structure 44C in the first direction D1 for contacting the second metal silicide layer 46 and being electrically connected with the fifth source/drain structure 44C via the second metal silicide layer 46, but not limited thereto. In some embodiments, the contact structure CT5, the contact structure CT6, the contact structure CT1, the contact structure CT2, the contact structure CT3, and the contact structure CT4 described above may be formed concurrently by the same manufacturing process and have the same material composition, but not limited thereto.

Figure 17:
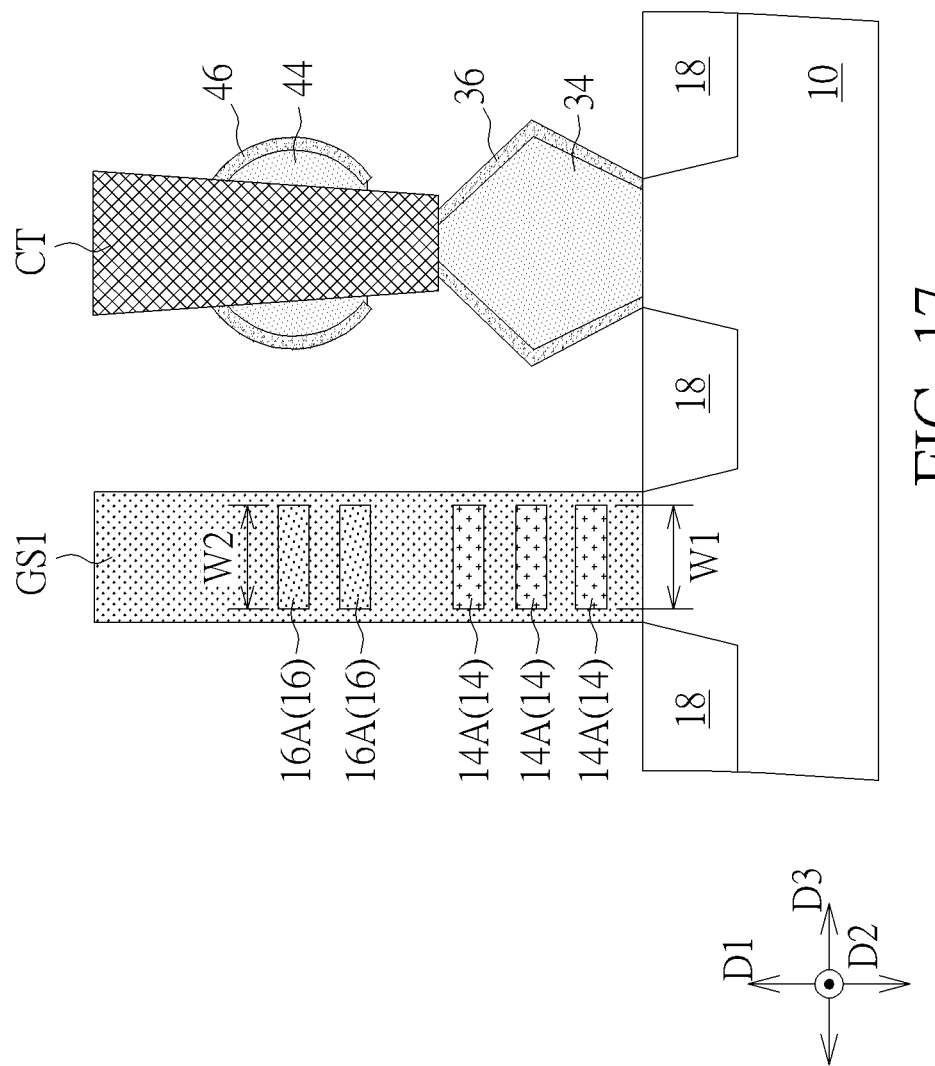
FIG. 17 is a cross-sectional schematic drawing illustrating a portion of the semiconductor device according to the third embodiment of the present invention.
Figure 18:
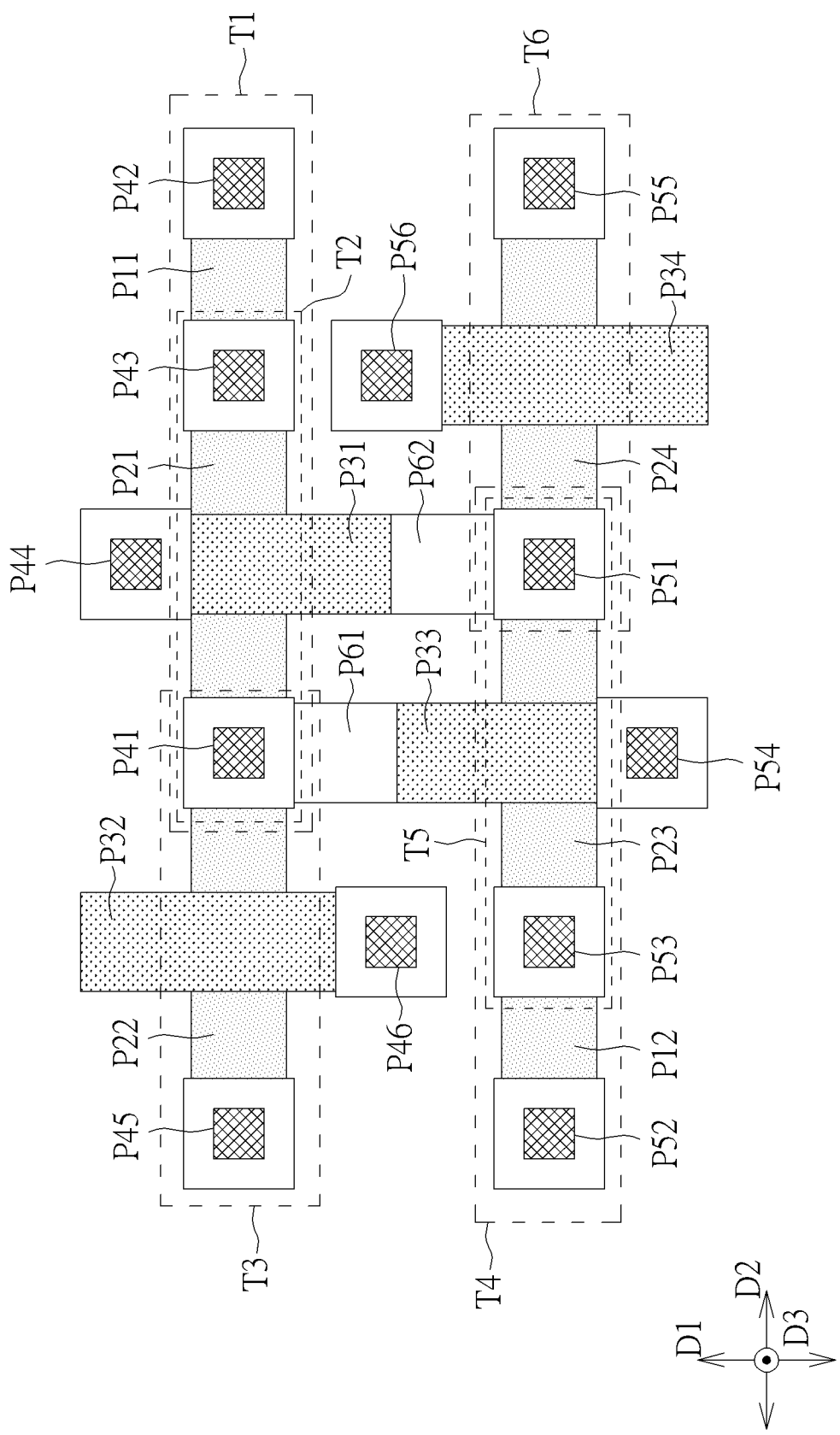
FIG. 18 is a schematic drawing illustrating a layout pattern of the semiconductor device according to the third embodiment of the present invention.
Figure 19:
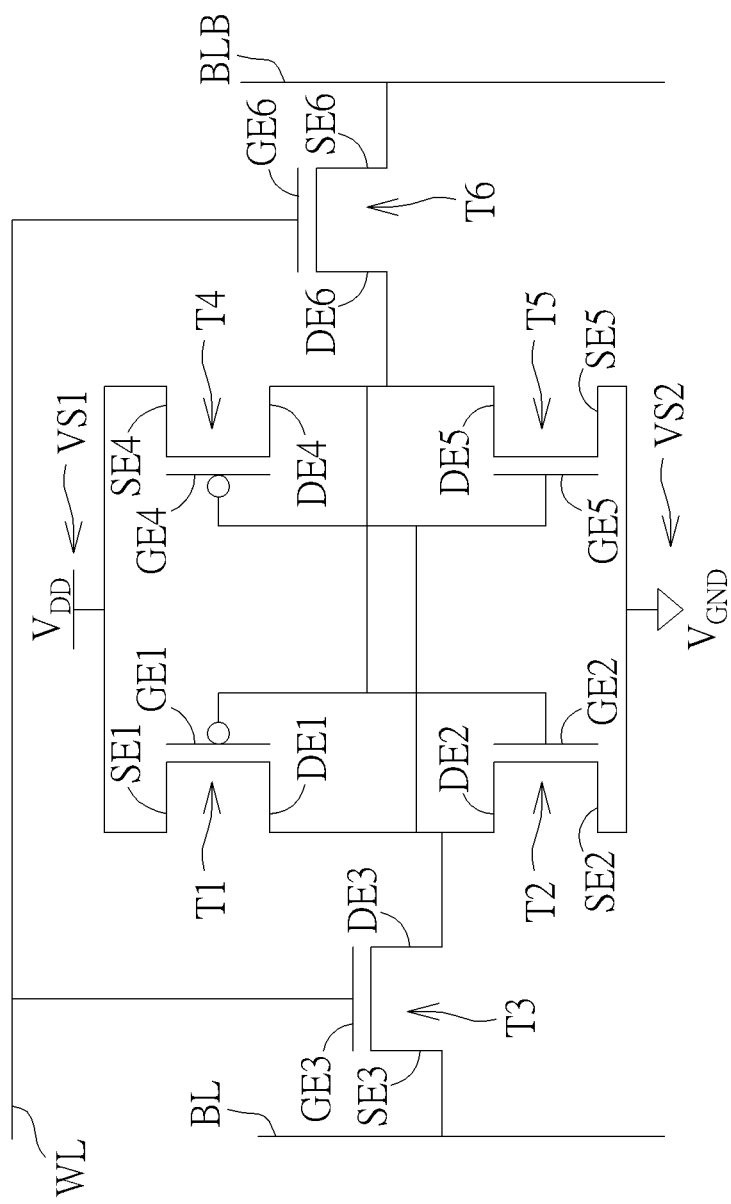
FIG. 19 is a schematic circuit diagram of the semiconductor device according to the third embodiment of the present invention.

Please refer to FIGS. 16-19. FIG. 17 is a cross-sectional schematic drawing illustrating a portion of the semiconductor device in this embodiment, FIG. 18 is a schematic drawing illustrating a layout pattern of the semiconductor device in this embodiment, and FIG. 19 is a schematic circuit diagram of the semiconductor device in this embodiment. As shown in FIG. 16 and FIG. 19, in some embodiments, the first transistor T1 may be a pull-up transistor in a static random access memory (SRAM) structure, which is a p-type transistor; the second transistor T2 may be a pull-down transistor in this SRAM structure, which is an n-type transistor; and the third transistor T3 may be a passing gate transistor in this SRAM structure, which is an n-type, but not limited thereto. In addition, the semiconductor device in this embodiment may further include a fourth transistor T4, a fifth transistor T5, and a sixth transistor T6. The fourth transistor T4 may be another pull-up transistor in this SRAM structure, which is a p-type transistor; the fifth transistor T5 may be another pull-down transistor in this SRAM structure, which is an n-type transistor; and the sixth transistor T6 may be another passing gate transistor in this SRAM structure, which is an n-type, but not limited thereto.

In some embodiments, a source electrode SE1 of the first transistor T1 (such as the second source/drain structure 34B) may be electrically connected to a voltage source VS1, and a drain electrode DE1 of the first transistor T1 (such as the first source/drain structure 34A) may be electrically connected with a drain electrode DE2 of the second transistor T2 (such as the third source/drain structure 44A). A gate electrode GE1 of the first transistor T1 (such as the first portion GS11 of the first gate structure GS1) may be electrically connected with a gate electrode GE2 of the second transistor T2 (such as the second portion GS12 of the first gate structure GS1), and a source electrode SE2 of the second transistor T2 (such as the fourth source/drain structure 44B) may be electrically connected to a voltage source VS2. In addition, a drain electrode DE3 of the third transistor T3 (such as the third source/drain structure 44A) may be electrically connected with the drain electrode DE1 of the first transistor T1 and the drain electrode DE2 of the second transistor T2, and a gate electrode GE3 of the third transistor T3 (such as a first portion GS21 of the second gate structure GS2) and a source electrode SE3 of the third transistor T3 (such as the fifth source/drain structure 44C) may be electrically connected to a word line WL and a bit line BL, respectively. Similarly, a source electrode SE4 of the fourth transistor T4 may be electrically connected to the voltage source VS1, and a drain electrode DE4 of the fourth transistor T4 may be electrically connected with a drain electrode DE5 of the fifth transistor T5. A gate electrode GE4 of the fourth transistor T4 may be electrically connected with a gate electrode GE5 of the fifth transistor T5, and a source electrode SE5 of the fifth transistor T5 may be electrically connected to the voltage source VS2. In addition, a drain electrode DE6 of the sixth transistor T6 may be electrically connected with the drain electrode DE4 of the fourth transistor T4 and the drain electrode DE5 of the fifth transistor T5, and a gate electrode GE6 and a source electrode SE6 of the sixth transistor T6 may be electrically connected to the word line WL and another bit line BLB, respectively. Additionally, in some embodiments, the voltage source VS1 may be power voltage (such as $V_{DD}$), the voltage source VS2 may be ground voltage (such as $V_{GND}$), and the static random access memory structure in this embodiment may be regarded as a six-transistor SRAM (6T-SRAM), but not limited thereto.

In some embodiments, the fourth transistor T4, the fifth transistor T5, and the sixth transistor T6 may be disposed substantially symmetrical to the first transistor T1, the second transistor T2, and the third transistor T3, respectively. The cross-section structure of the fourth transistor T4 may be similar to the cross-section structure of the first transistor T1 shown in FIG. 16, the cross-section structure of the fifth transistor T5 may be similar to the cross-section structure of the second transistor T2 shown in FIG. 16, and the cross-section structure of the sixth transistor T6 may be similar to the cross-section structure of the third transistor T3 shown in FIG. 16, but not limited thereto. As shown in FIG. 16 and FIG. 18, in some embodiments, the active region pattern P11, an active region pattern P12, the active region pattern P21, an active region pattern P22, an active region pattern P23, and an active region pattern P24 may be used to define locations of different active regions in the semiconductor device of this embodiment. For example, the active region pattern P11 may correspond to the location of the first semiconductor channel layer 14A, the first source/drain structure 34A, and the second source/drain structure 34B of the first transistor T1 in a top view of the semiconductor device; the active region pattern P12 may correspond to the location of a semiconductor channel layer (not shown) and source/drain structures (such as the source electrode SE4 and the drain electrode DE4) of the fourth transistor T4 in the top view of the semiconductor device; the active region pattern P21 may correspond to the location of the second semiconductor channel layer 16A, the third source/drain structure 44A, and the fourth source/drain structure 44B of the second transistor T2 in the top view of the semiconductor device; the active region pattern P22 may correspond to the location of the third semiconductor channel layer 16B, the third source/drain structure 44A, and the fifth source/drain structure 44C of the third transistor T3 in the top view of the semiconductor device; the active region pattern P23 may correspond to the location of a semiconductor channel layer (not shown) and source/drain structures (such as the source electrode SE5 and the drain electrode DE5) of the fifth transistor T5 in the top view of the semiconductor device; and the active region pattern P24 may correspond to the location of a semiconductor channel layer (not shown) and source/drain structures (such as the source electrode SE6 and the drain electrode DE6) of the sixth transistor T6 in the top view of the semiconductor device, but not limited thereto.

In addition, the gate electrode pattern P31 may be used to define the location of the first gate structure GS1 and/or the location of the dummy gate structure corresponding to the first gate structure GS1 (such as the dummy gate structure 20 shown in FIG. 10); a gate electrode pattern P32 may be used to define the location of the second gate structure GS2 and/or the location of the dummy gate structure corresponding to the second gate structure GS2 (not shown); a gate electrode pattern P33 may be used to define the location of the gate structure of the fourth transistor T4 and the fifth transistor T5 (such as the gate electrode GE4 and the gate electrode GE5) and/or the location of the dummy gate structure corresponding to this gate structure (not shown); and a gate electrode pattern P34 may be used to define the location of the gate structure of the sixth transistor T6 (such as the gate electrode GE6) and/or the location of the dummy gate structure corresponding to this gate structure (not shown). Additionally, the contact pattern P41, the contact pattern P42, the contact pattern P43, the contact pattern P44, a contact pattern P45, and a contact pattern P46 may be used to define the location of the contact structure CT1, the location of the contact structure CT2, the location of the contact structure CT3, the location of the contact structure CT4, the location of the contact structure CT5, and the location of the contact structure CT6, respectively. A contact pattern P51, a contact pattern P52, a contact pattern P53, a contact pattern P54, a contact pattern P55, and a contact pattern P56 may be used to define a location of a contact structure corresponding to the drain electrode DE4 of the fourth transistor T4 and the drain electrode DE5 of the fifth transistor T5 (not shown), a location of a contact structure corresponding to the source electrode SE4 of the fourth transistor T4 (not shown), a location of a contact structure corresponding to the source electrode SE5 of the fifth transistor T5 (not shown), a location of a contact structure corresponding to a gate structure shared by the fourth transistor T4 and the fifth transistor T5 (not shown), a location of a contact structure corresponding to the source electrode SE6 of the sixth transistor T6 (not shown), and a location of a contact structure corresponding to the gate electrode GE6 of the sixth transistor T6 (not shown), respectively. Additionally, a connection pattern P61 may be used to define a location of a connection structure electrically connecting the drain electrode DE1 of the first transistor T1 and the gate electrode GE4 of the fourth transistor T4 (not shown), and a connection pattern P62 may be used to define a location of a connection structure electrically connecting the drain electrode DE4 of the fourth transistor T4 and the gate electrode GE1 of the first transistor T1 (not shown), but not limited thereto. The area occupied by the structure of the SRAM memory unit may be reduced by stacking the first transistor T1 and the second transistor T2 partially overlapping the first transistor T1 and stacking the fourth transistor T4 and the fifth transistor T5 partially overlapping the fourth transistor T4, and it is beneficial to the density improvement of the memory units in related products.

As shown in FIGS. 16-18, in some embodiments, a width W1 of each of the first semiconductor channel layers 14A may be substantially equal to a width W2 of each of the second semiconductor channel layers 16A, but not limited thereto. The width W1 of each of the first semiconductor channel layers 14A may be regarded as a length of each of the first semiconductor channel layers 14A in the third direction D3, the width W2 of each of the second semiconductor channel layers 16A may be regarded as a length of each of the second semiconductor channel layers 16A in the third direction D3, and the third direction D3 may be substantially orthogonal to the second direction D2, but not limited thereto. In addition, the epitaxial material 34 shown in FIG. 17 may correspond to the drain electrode of the fourth transistor T4, the epitaxial material 44 shown in FIG. 17 may correspond to the drain electrode of the fifth transistor T5, and a contact structure CT shown in FIG. 17 may be regarded as a contact structure electrically connecting the drain electrode of the fourth transistor T4 and the drain electrode of the fifth transistor T5, but not limited thereto. In some embodiments, a cross-sectional shape of the epitaxial material 34 may be different from a cross-sectional shape of the epitaxial material 44 because the material compositions of the epitaxial materials are different from each other, but not limited thereto.

Figure 20:
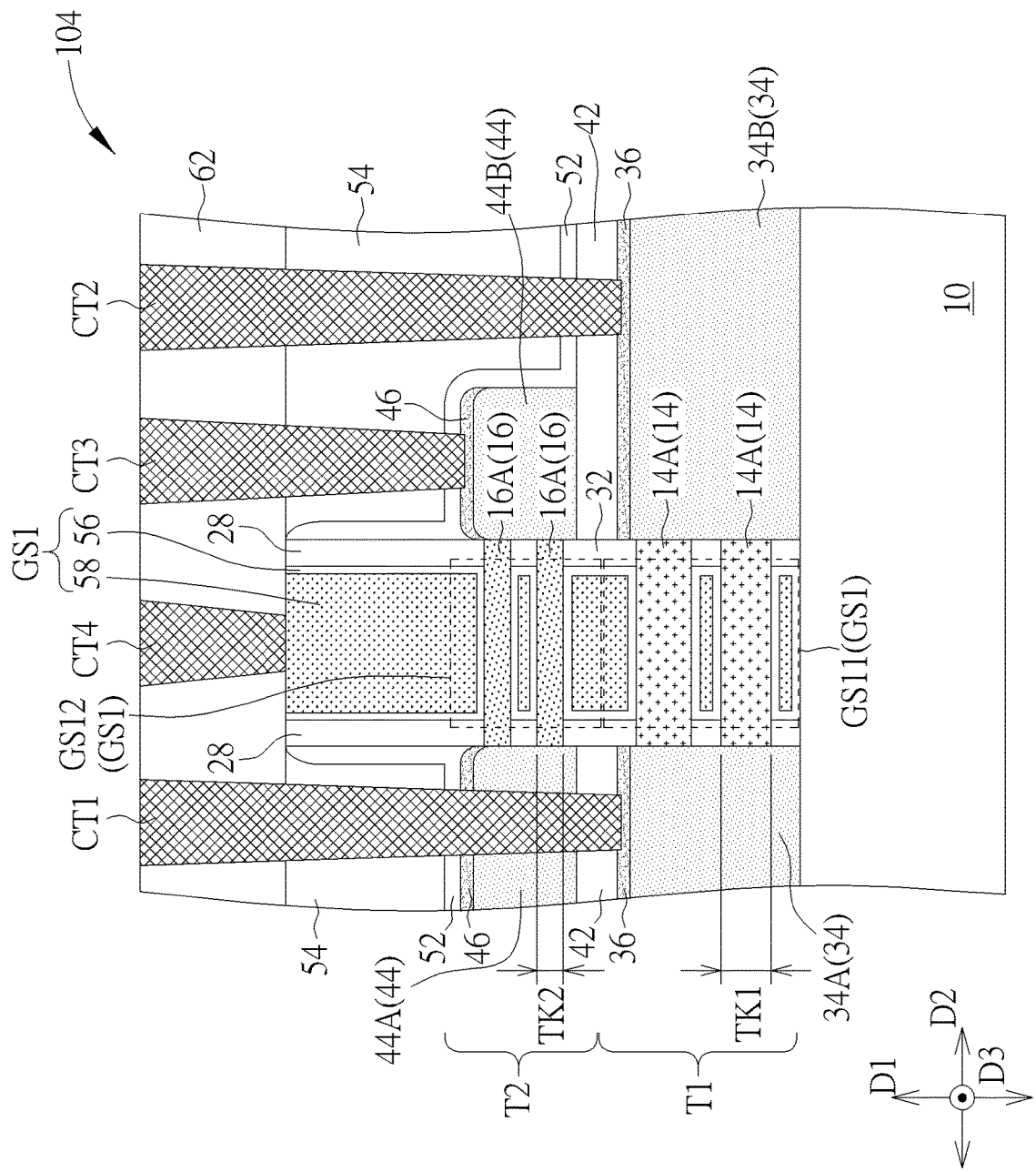
FIG. 20 is a schematic drawing illustrating a semiconductor device according to a fourth embodiment of the present invention.

Please refer to FIG. 20. FIG. 20 is a schematic drawing illustrating a semiconductor device 104 according to a fourth embodiment of the present invention. As shown in FIG. 20, in the semiconductor device 104, a thickness TK1 of each of the first semiconductor channel layers 14A in the first direction D1 may be different from a thickness TK2 of each of the second semiconductor channel layers 16A in the first direction D1 for adjusting the surface area of the first semiconductor channel layers 14A encompassed by the first gate structure GS1 in the first transistor T1 and the surface area of the second semiconductor channel layers 16A encompassed by the first gate structure GS1 in the second transistor T2, respectively, and the electrical characteristics of the first transistor T1 and the second transistor T2 may meet the design requirements accordingly, especially when the conductivity type of the first transistor T1 is different from the conductivity type of the second transistor T2, but not limited thereto. For example, the thickness TK1 of each of the first semiconductor channel layers 14A may be greater than the thickness TK2 of each of the second semiconductor channel layers 16A, and the number of the first semiconductor channel layers 14A in the first transistor T1 may be equal to the number of the second semiconductor channel layers 16A in the second transistor T2, but not limited thereto. In some embodiments, the thickness TK1 of each of the first semiconductor channel layers 14A may be different from the thickness TK2 of each of the second semiconductor channel layers 16A while the number of the first semiconductor channel layers 14A in the first transistor T1 is different from the number of the second semiconductor channel layers 16A in the second transistor T2 according to some design considerations.

Figure 21:
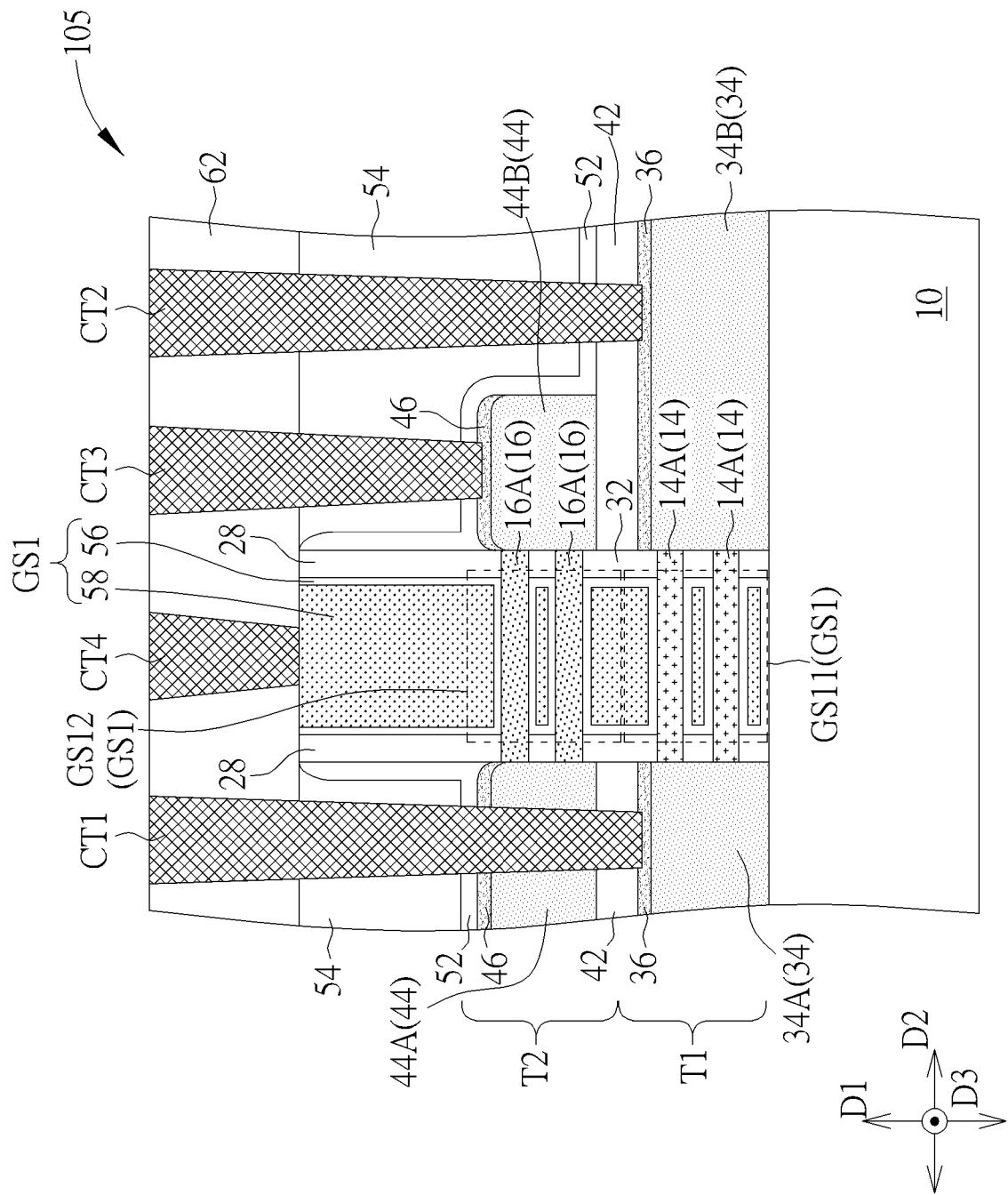
FIG. 21 is a schematic drawing illustrating a semiconductor device according to a fifth embodiment of the present invention.

Please refer to FIG. 21. FIG. 21 is a schematic drawing illustrating a semiconductor device 105 according to a fifth embodiment of the present invention. As shown in FIG. 21, in the semiconductor device 105, the number of the first semiconductor channel layers 14A in the first transistor T1 may be equal to the number of the second semiconductor channel layers 16A in the second transistor T2, the thickness of each of the first semiconductor channel layers 14A may be substantially equal to the thickness of each of the second semiconductor channel layers 16A, but the material composition of each of the first semiconductor channel layers 14A may be different from the material composition of each of the second semiconductor channel layers 16A for modifying the electrical characteristics of the first transistor T1 and the electrical characteristics of the second transistor T2 respectively in order to meet the design requirements, especially when the conductivity type of the first transistor T1 is different from the conductivity type of the second transistor T2, but not limited thereto.

Figure 22:
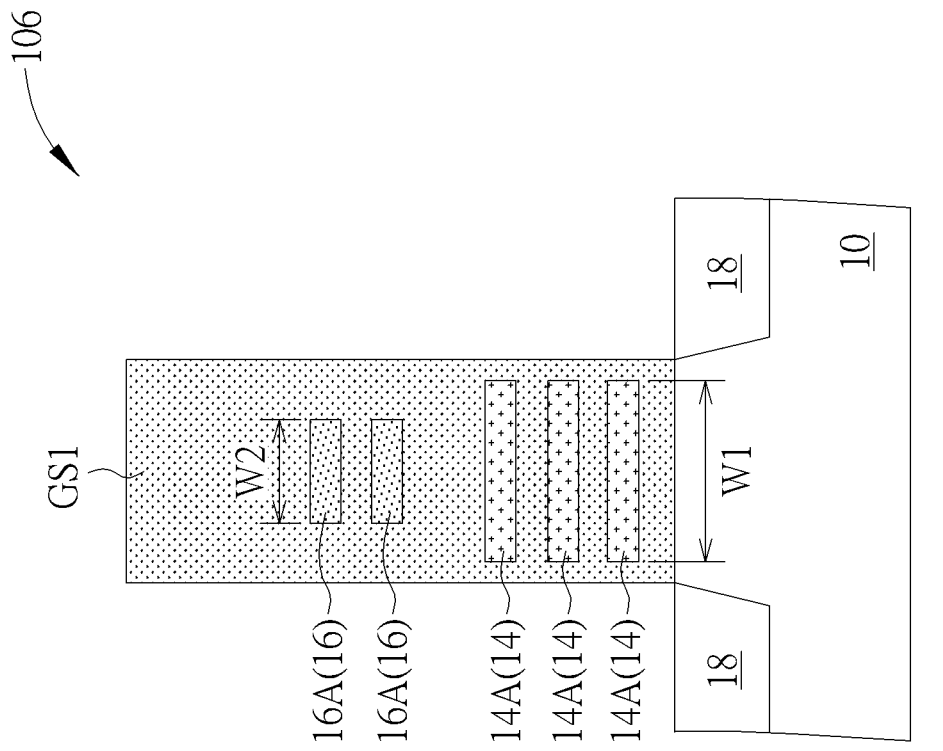
FIG. 22 is a schematic drawing illustrating a portion of a semiconductor device according to a sixth embodiment of the present invention.

Please refer to FIG. 22. FIG. 22 is a schematic drawing illustrating a portion of a semiconductor device 106 according to a sixth embodiment of the present invention. As shown in FIG. 22, in the semiconductor device 106, the width W1 of each of the first semiconductor channel layers 14A may be different from the width W2 of each of the second semiconductor channel layers 16A for modifying the electrical characteristics of the first transistor T1 and the electrical characteristics of the second transistor T2 respectively in order to meet the design requirements, especially when the conductivity type of the first transistor T1 is different from the conductivity type of the second transistor T2, but not limited thereto. For example, the width W1 of each of the first semiconductor channel layers 14A may be greater than the width W2 of each of the second semiconductor channel layers 16A, and the surface area of the first semiconductor channel layers 14A encompassed by the first gate structure GS1 in the first transistor T1 may be greater than the surface area of the second semiconductor channel layers 16A encompassed by the first gate structure GS1 in the second transistor T2 accordingly. In addition, while the width W1 of each of the first semiconductor channel layers 14A is different from the width W2 of each of the second semiconductor channel layers 16A, the number of the first semiconductor channel layers 14A in the first transistor T1 may be equal to or different from the number of the second semiconductor channel layers 16A in the second transistor T2 according to some process and/or design considerations.

To summarize the above descriptions, in the semiconductor device and the manufacturing method thereof in the present invention, two transistors are stacked and partially overlap, and the source/drain structures of the stacked transistors are electrically connected with each other via the contact structure penetrating through the source/drain structure of the upper transistor. The area occupied by the semiconductor device may be reduced, and the density of the transistors and/or the density of the semiconductor units (such as the memory units) in the related product may be increased accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
  a substrate;
  a first transistor disposed on the substrate, wherein the first transistor comprises:
    first semiconductor channel layers stacked in a vertical direction and separated from one another; and
    a first source/drain structure and a second source/drain structure disposed at two opposite sides of each of the first semiconductor channel layers in a horizontal direction respectively, wherein the first source/drain structure and the second source/drain structure are connected with the first semiconductor channel layers respectively;
  a second transistor disposed on the substrate, wherein the second transistor comprises:
    second semiconductor channel layers disposed above the first semiconductor channel layers, wherein the second semiconductor channel layers are stacked in the vertical direction and separated from one another; and
    a third source/drain structure and a fourth source/drain structure disposed at two opposite sides of each of the second semiconductor channel layers in the horizontal direction respectively, wherein the third source/drain structure and the fourth source/drain structure are connected with the second semiconductor channel layers respectively;
  a first contact structure penetrating through the third source/drain structure in the vertical direction, wherein the first source/drain structure is electrically connected with the third source/drain structure via the first contact structure, and a part of the first source/drain structure is disposed between the substrate and the first contact structure in the vertical direction;
a dielectric layer disposed between the first source/drain structure and the third source/drain structure in the vertical direction, wherein the first contact structure further penetrates through the dielectric layer in the vertical direction;
a second contact structure disposed on and electrically connected with the second source/drain structure;
a third contact structure disposed on and electrically connected with the fourth source/drain structure, wherein the second contact structure and the third contact structure are electrically separated from each other, the fourth source/drain structure overlaps a portion of the second source/drain structure in the vertical direction, and the second contact structure is disposed on another portion of the second source/drain structure without overlapping the fourth source/drain structure in the vertical direction;
a first metal silicide layer disposed between the dielectric layer and the first source/drain structure in the vertical direction, wherein the first contact structure directly contacts the first metal silicide layer for being electrically connected with the first source/drain structure via the first metal silicide layer;
a second metal silicide layer disposed on the third source/drain structure and the fourth source/drain structure; and
an etching stop layer disposed on and directly contacting the second metal silicide layer, a sidewall of the fourth source/drain structure, and the dielectric layer, wherein the third contact structure penetrates through the etching stop layer on the second metal silicide layer, and the second contact structure penetrates through the etching stop layer on the dielectric layer.

2. The semiconductor device according to claim 1, wherein the first transistor further comprises a first portion of a gate structure encompassing each of the first semiconductor channel layers, and the second transistor further comprises a second portion of the gate structure encompassing each of the second semiconductor channel layers, wherein the first portion of the gate structure is directly connected with the second portion of the gate structure and disposed between the second portion of the gate structure and the substrate in the vertical direction.

3. The semiconductor device according to claim 1, wherein the number of the first semiconductor channel layers in the first transistor is different from the number of the second semiconductor channel layers in the second transistor.

4. The semiconductor device according to claim 1, wherein a material composition of each of the first semiconductor channel layers is different from a material composition of each of the second semiconductor channel layers.

5. The semiconductor device according to claim 1, wherein a thickness of each of the first semiconductor channel layers in the vertical direction is different from a thickness of each of the second semiconductor channel layers in the vertical direction.

6. The semiconductor device according to claim 1, wherein a width of each of the first semiconductor channel layers is different from a width of each of the second semiconductor channel layers.

7. The semiconductor device according to claim 1, wherein the first transistor is a transistor of a first conductivity type, and the second transistor is a transistor of a second conductivity type complementary to the first conductivity type.

8. The semiconductor device according to claim 1, wherein the first transistor is a pull-up transistor in a static random access memory (SRAM) structure, and the second transistor is a pull-down transistor in the SRAM structure.

9. The semiconductor device according to claim 1, further comprising:
third semiconductor channel layers disposed on the substrate and stacked in the vertical direction, wherein the third source/drain structure is disposed between one of the second semiconductor channel layers and one of the third semiconductor channel layers in the horizontal direction; and
a fifth source/drain structure disposed on the substrate, wherein the third semiconductor channel layers are disposed between the fifth source/drain structure and the third source/drain structure in the horizontal direction, and the third semiconductor channel layers, the fifth source/drain structure, and the third source/drain structure constitutes a portion of a third transistor.

10. The semiconductor device according to claim 9, further comprising:
a fourth contact structure disposed on and electrically connected with the fifth source/drain structure.

11. The semiconductor device according to claim 9, wherein the first transistor is a transistor of a first conductivity type, and the second transistor the third transistor are transistors of a second conductivity type complementary to the first conductivity type.

12. The semiconductor device according to claim 9, wherein the third transistor is a passing gate transistor in a static random access memory (SRAM) structure.

13. The semiconductor device according to claim 1, wherein the third contact structure does not overlap the second contact structure in the vertical direction.

* * * * *